US011029059B2

(12) United States Patent
Towner et al.

(10) Patent No.: US 11,029,059 B2
(45) Date of Patent: Jun. 8, 2021

(54) PASSIVE COOLING SYSTEM WITH AMBIENT FLUID COLLECTION

(71) Applicant: Amazon Technologies, Inc., Reno, NV (US)

(72) Inventors: Richard Chadwick Towner, Front Royal, VA (US); Joshua Ehren Nestor, Unionville, VA (US); Matthew Thomas Phillips, Seattle, WA (US); Ishwar Ryan Maheepat, Manassas, VA (US)

(73) Assignee: Amazon Technologies, Inc., Seattle, WA (US)

( * ) Notice: Subject to any disclaimer, the term of this patent is extended or adjusted under 35 U.S.C. 154(b) by 1200 days.

(21) Appl. No.: 14/043,660

(22) Filed: Oct. 1, 2013

(65) Prior Publication Data

US 2015/0093985 A1 Apr. 2, 2015

(51) Int. Cl.
F24F 13/20 (2006.01)
F24F 11/00 (2018.01)
(Continued)

(52) U.S. Cl.
CPC .......... F24F 13/20 (2013.01); F24F 11/0001 (2013.01); F24F 13/14 (2013.01);
(Continued)

(58) Field of Classification Search
CPC ........ F24F 13/20; F24F 1/0022; F24F 1/0011; F24F 1/0007; F24F 2001/0037;
(Continued)

(56) References Cited

U.S. PATENT DOCUMENTS 1,673,906 A * 6/1928 Fager ...................... E06B 7/082
454/279
1,995,456 A * 3/1935 Charles .................... F24F 13/08
160/104
(Continued)

FOREIGN PATENT DOCUMENTS

CN 102387685 3/2012
CN 102394479 3/2012
(Continued)

OTHER PUBLICATIONS

TheFreeDictionary.com, "chimney effect", definition of known term (Year: 2020).*
(Continued)

Primary Examiner — Steven B McAllister
Assistant Examiner — Elizabeth M. May
(74) Attorney, Agent, or Firm — Robert C Kowert; Kowert, Hood, Munyon, Rankin & Goetzel, P.C.

(57) ABSTRACT

A passive cooling system routes air from an enclosure to an ambient environment, via a chimney effect, through one or more indirect pathways and re-directs environmental elements received from the ambient environment. One or more vanes are arranged within an interior space, such that the vanes collectively form one or more indirect pathways to the ambient environment. The vanes preclude environmental elements, including precipitation and particulate matter, from passing through the interior space and into the enclosure. Environmental elements are re-directed by one or more of the vanes, at least in part, to an exterior of the passive exhaust system. Dampers may be adjusted to control airflow through the passive cooling system and restrict environmental elements from entering the passive cooling system. Liquids received from the ambient environment may be (Continued)

re-directed into a reclamation system for use in a cooling system.

10 Claims, 14 Drawing Sheets

(51) Int. Cl.
*F24F 13/14* (2006.01)
*H05K 5/02* (2006.01)
*H05K 7/20* (2006.01)

(52) U.S. Cl.
CPC ....... *H05K 5/0213* (2013.01); *H05K 7/20709* (2013.01); *H05K 7/20745* (2013.01)

(58) Field of Classification Search
CPC ........ F24F 13/08; F24F 1/0003; F24F 1/0014; F24F 2001/0048; F25D 17/06
USPC .......................................... 454/363; 165/122
See application file for complete search history.

(56) References Cited

U.S. PATENT DOCUMENTS

| | | | | | |
|---|---|---|---|---|---|
| 2,569,689 | A * | 10/1951 | Porter | ...................... | F24F 13/08 454/224 |
| 2,595,885 | A * | 5/1952 | Rhoades | ................ | A01K 31/00 454/256 |
| 3,050,961 | A * | 8/1962 | Mann | ..................... | F25D 17/065 62/419 |
| 3,384,165 | A * | 5/1968 | Mathews | .................. | F28B 1/06 165/122 |
| 3,782,050 | A * | 1/1974 | Dowdell | ................. | F24F 13/08 52/473 |
| 3,996,314 | A * | 12/1976 | Lakmaker | ................. | F28B 1/06 261/30 |
| 4,064,670 | A * | 12/1977 | Lichtenwald | ........... | E06B 7/082 52/473 |
| 4,078,477 | A * | 3/1978 | Sommer | .................. | H02K 9/26 454/279 |
| 4,337,823 | A * | 7/1982 | DelPercio | ............... | F24H 3/062 165/122 |
| 4,432,514 | A * | 2/1984 | Brandon | .................. | B64C 1/18 137/513.3 |
| 4,522,255 | A * | 6/1985 | Baker | ................... | F24F 1/0047 165/48.1 |
| 4,958,555 | A * | 9/1990 | Lentz | ...................... | F24F 13/08 454/277 |
| 5,297,373 | A * | 3/1994 | Olsen | ..................... | E06B 7/082 52/473 |
| 5,377,503 | A * | 1/1995 | Reedy | .................... | F24F 1/0014 165/137 |
| 5,526,626 | A * | 6/1996 | Loucks | ..................... | E04D 1/08 428/906 |
| 5,542,224 | A * | 8/1996 | Olsen | .................... | F24F 11/08 454/277 |
| 55,422,244 | | 8/1996 | Olsen | | |
| 5,582,026 | A * | 12/1996 | Barto, Sr. | ............. | F24F 1/0003 62/298 |
| 5,906,083 | A * | 5/1999 | Olsen | ....................... | E06B 7/08 454/277 |
| 6,138,424 | A * | 10/2000 | Akerson | ................ | F24F 13/082 454/279 |
| 6,870,735 | B2 * | 3/2005 | Genova | ................ | H01L 23/367 165/185 |
| 7,640,710 | B1 * | 1/2010 | McAtee | ................ | F24F 13/084 454/277 |
| 7,905,947 | B2 * | 3/2011 | Leseman | .............. | B01D 46/002 55/282 |
| 8,684,803 | B2 * | 4/2014 | Berkompas | ........... | F24F 13/082 454/277 |
| 8,936,660 | B2 * | 1/2015 | Cruz Aguado | ........... | F24F 7/00 454/196 |
| 9,745,791 | B1 * | 8/2017 | Rohovit | .................... | E06B 1/62 |
| 2003/0199245 | A1 * | 10/2003 | Akhtar | .................. | F24F 3/0442 454/262 |
| 2006/0185381 | A1 * | 8/2006 | Kim | ..................... | F24F 1/0007 62/331 |
| 2007/0062370 | A1 * | 3/2007 | Ahn | ...................... | F24F 3/1423 95/115 |
| 2009/0000210 | A1 * | 1/2009 | Barnett | ................. | E04D 13/076 52/12 |
| 2009/0217694 | A1 * | 9/2009 | Kim | ..................... | F25D 17/042 62/426 |
| 2010/0089259 | A1 * | 4/2010 | Hallman | ............... | B30B 9/3039 100/188 R |
| 2010/0192611 | A1 * | 8/2010 | Yamaguchi | ............. | F24F 13/14 62/291 |
| 2010/0199697 | A1 * | 8/2010 | Sakashita | ........... | B01D 46/0065 62/259.1 |
| 2010/0317281 | A1 * | 12/2010 | Sperandio | ............... | E06B 7/082 454/224 |
| 2011/0040412 | A1 * | 2/2011 | Wiese | ...................... | F24F 7/013 700/275 |
| 2011/0056220 | A1 * | 3/2011 | Caggiano | ............. | B01D 53/002 62/94 |
| 2011/0100052 | A1 * | 5/2011 | Yumoto | ............. | B01D 46/0065 62/426 |
| 2013/0048742 | A1 * | 2/2013 | Menden | ................ | F24F 1/0003 236/49.3 |
| 2013/0242504 | A1 * | 9/2013 | Cartes | ................ | G05D 23/1931 361/679.49 |
| 2015/0354872 | A1 * | 12/2015 | Cur | ....................... | F24F 1/0003 62/119 |

FOREIGN PATENT DOCUMENTS

| | | |
|---|---|---|
| DE | 102004027101 | 12/2005 |
| JP | Sho 52-55875 | 12/1977 |
| JP | Hei 5-44314 | 6/1980 |
| JP | Hei 2-116630 | 9/1990 |
| JP | H0486013 | 3/1992 |
| JP | Hei 5-44314 | 2/1993 |
| JP | H06217424 | 5/1994 |
| WO | 2012113895 | 8/2012 |

OTHER PUBLICATIONS

Office Action from Chinese Application No. 201480059588.6, dated Jan. 1, 2018 (English translation & Chinese version), Amazon Technologies, Inc., pp. 1-14.
International Search Report and Written Opinion from PCT/US2014/058651, dated Jan. 23, 2015, Amazon Technologies, Inc., pp. 1-12.
Office Action from Japanese Application No. 2016-519819, dated May 9, 2017 (English translation and Japanese version), pp. 1-14.
"Louvers, Screens & Grilles" Ruskin, Kansas City, Missouri, Aug. 2009, pp. 1-12.

* cited by examiner

PASSIVE COOLING SYSTEM WITH AMBIENT FLUID COLLECTION

BACKGROUND

Electronic components generate waste heat energy when in use. This heat energy should be removed to mitigate a potential for component overheating and subsequent malfunction. Computer systems typically include a number of such components, or waste heat sources, that include, but are not limited to, printed circuit boards, mass storage devices, power supplies, and processors. For example, one personal computer system may generate 100 watts to 150 watts of waste heat and some larger computers with multiple processors may generate 250 watts of waste heat. Some known computer systems include a plurality of such larger, multiple-processor computers that are configured into rack-mounted components, and then are subsequently positioned within a rack computing system. Some known rack computing systems include 40 such rack-mounted components and such rack computing systems will therefore generate as much as 10 kilowatts of waste heat. Moreover, some known data centers include a plurality of such rack computing systems.

Various structures with waste heat sources often include methods and apparatuses configured to facilitate waste heat removal from some part of the structure. Where a structure includes an enclosure in which waste heat sources are located, the methods and apparatuses may be configured to facilitate waste heat removal from the waste heat sources the enclosure, or some combination thereof. For example, a data center may include methods and apparatuses may be configured to facilitate waste heat removal from a plurality of rack computing systems.

Some waste heat removal systems remove waste heat from data centers by transferring waste heat to flows of air ("exhaust air"), which are then used to transport the waste heat to an environment external to the data center. Such an environment can include an ambient environment.

Waste heat removal systems often use mechanical systems that use moving parts to facilitate waste heat removal from the data centers. For example, some waste heat removal systems in some data centers may utilize blowers, fans, or the like to induce one or more flows of air, including exhaust air, to transport waste heat out of the data center. Such systems usually consume electricity and may themselves generate waste heat, further increasing the amount of waste heat that must be removed from the data center and necessitating the mechanical systems to be enlarged to handle the greater waste heat load. Furthermore, due to having moving parts, such systems are subject to wear and often require periodic maintenance and replacement of components to maintain heat removal capabilities.

Environmental conditions of an ambient environment may be non-uniform and may fluctuate with minimal warning, even at a given location. Aside from the significant changes in temperature and humidity that can occur with the change of seasons, environmental quality of the ambient environment may vary due to a myriad of external factors. Such variation in environmental conditions can create challenges in removing waste heat from an enclosure that has waste heat sources to the ambient environment. For example, precipitation, including rain, snow, ice, hail, and the like, smoke, smog, particulate matter, and airborne by-products of industrial and/or agricultural activities can all affect usability of outside air as a reservoir for air carrying waste heat and can further enter the data center through pathways normally used to expel waste heat into the ambient environment and may contaminate or damage various systems in the data center.

Figure 1:
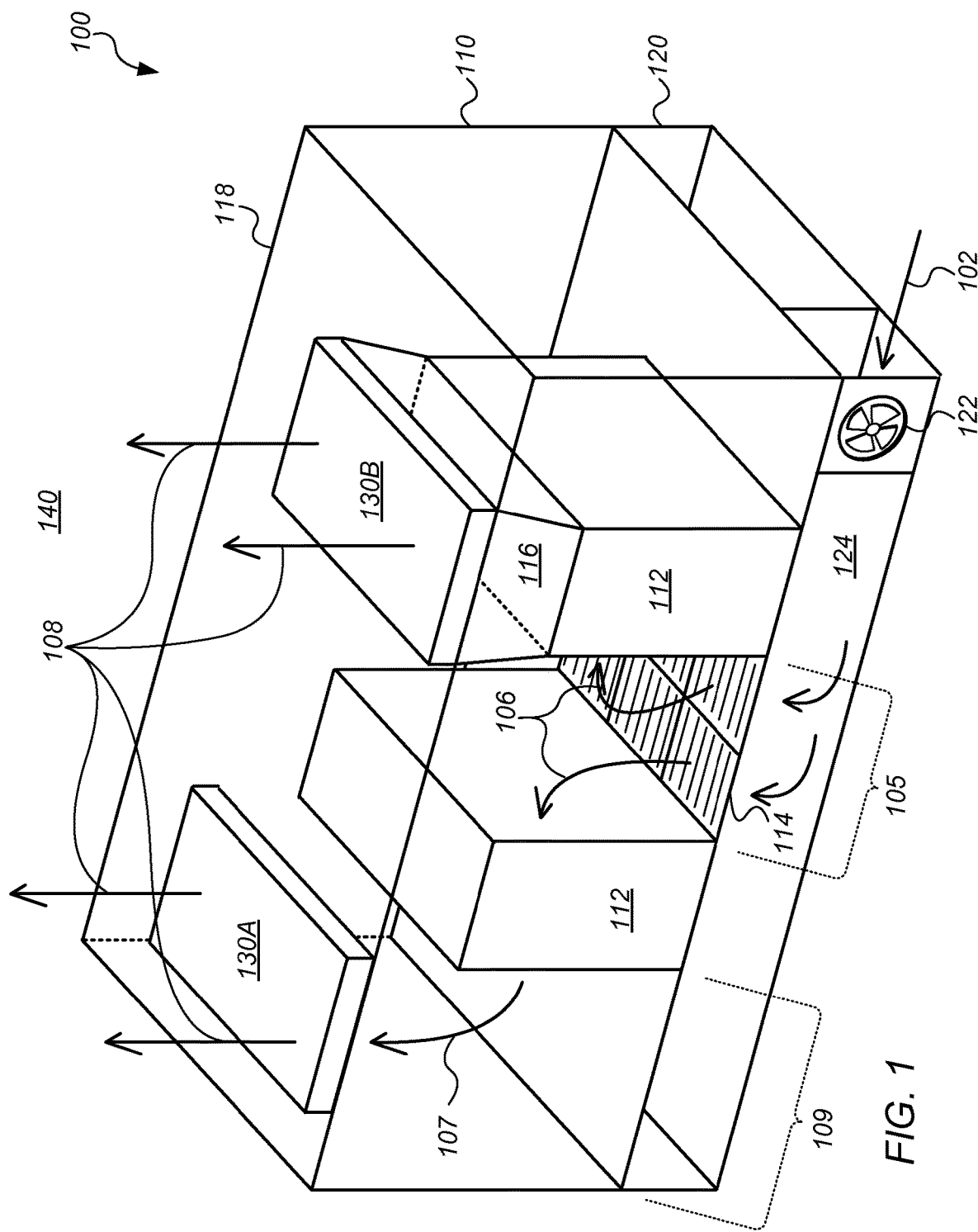
FIG. 1 is a schematic diagram illustrating a data center that includes a passive cooling system according to one embodiment.

The various embodiments described herein are susceptible to various modifications and alternative forms. Specific embodiments are shown by way of example in the drawings and will herein be described in detail. It should be understood, however, that the drawings and detailed description thereto are not intended to limit the disclosure to the particular form disclosed, but on the contrary, the intention is to cover all modifications, equivalents and alternatives falling within the spirit and scope of the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Various embodiments of a passive cooling system with ambient fluid collection are disclosed. According to one embodiment, a data center includes a computer room including a computing system that outputs exhaust air and a passive cooling system that routes the exhaust air, via a chimney effect, from the computer room to an ambient environment external to the computer room and precludes liquids received into the passive cooling system from the ambient environment from entering the computer room. The passive cooling system includes an interior space, vanes, and a panel gutter. The interior space is at least partially bounded by side panels, at least partially open to the computer room through a bottom portion, and at least partially open to the ambient environment through a top portion. The vanes are disposed within the interior space and each include a vane gutter that collects liquids and a vane ramp that routes liquids received into the passive cooling system from the ambient environment into the vane gutter. The vanes are arranged into vertically-arranged rows, each vane row including vanes horizontally-arranged in parallel, such that vanes of each individual vane row are horizontally offset in a vertical axis from vanes of other vane rows, such that the vanes collectively route exhaust air from the portion of the computer room to the ambient environment, via a chimney effect, along a non-linear pathway. The panel gutter extends along an interior face of one of the side panels and routes liquids out of the interior space, where each of the vanes routes liquids from at least one vane gutter into at least one panel gutter, such that liquids received into the passive cooling system from the ambient environment are routed to an exterior of the interior space.

According to one embodiment, an apparatus includes side panels that bound at least part of an interior space, vanes disposed within the interior space, and a panel gutter. One or more of the vanes includes a vane ramp and a vane gutter and routes at least some fluids received into the interior space into the vane gutter based at least in part on the vane ramp. The vanes are arranged into a plurality of vertically-arranged, horizontally-offset rows, at least one which includes the at least one of the plurality of vanes, that form an indirect pathway through the interior space. The indirect pathway is to direct fluids received into the interior space to the vane gutter of the vane. The panel gutter is coupled to one of the side panels and receives fluids from at least one of the vane gutters, such that some fluids received into the interior space and directed to a vane gutter are further directed to the panel gutter via the vane gutter.

According to one embodiment, an apparatus includes a partial enclosure and at least one vane disposed within the partial enclosure. The partial enclosure is at least partially open to an interior environment at a lower end and at least partially open to an ambient environment at an upper end. The vane forms at least one vertically-oriented indirect pathway from the lower end of the partial enclosure to the upper end of the partial enclosure. The vane passively channels air, based at least in part on a chimney effect, from the interior environment to the ambient environment along the at least one vertically-oriented indirect pathway through the partial enclosure. The vane re-directs precipitation entering the partial enclosure from the ambient environment via the upper end of the partial enclosure, such that the precipitation is removed from the partial enclosure.

As used herein, "data center" includes any facility or portion of a facility in which computer operations are carried out. A data center may include servers and other systems and components dedicated to specific functions (e.g., e-commerce transactions, database management) or serving multiple functions. Examples of computer operations include information processing, communications, simulations, and operational control.

As used herein, "mechanical cooling" means cooling of air by a process that involves doing mechanical work on at least one fluid, such as occurs in vapor-compression refrigeration systems.

As used herein, "evaporative cooling" means cooling of air by evaporation of liquid.

As used herein, "direct evaporative cooling" means cooling of air by evaporation of liquid directly into a stream of air to be cooled.

As used herein, "adiabatic system" means a system that cools by evaporation of a liquid.

As used herein, "ambient" refers to a condition of outside air at the location of a system, structure, data center, etc. An ambient temperature may be taken, for example, at or near an intake hood of an air handling system.

As used herein, a "chimney effect" or "stack effect" refers to a flow of air through a pathway that is induced by an air density difference between the ends of the pathway. Such a difference may be induced by one or more various factors, including temperature differences between the ends of the pathway, ambient pressure differences, humidity differences, and the like. For example, where a building with a warm enclosure is surrounded by a colder ambient environment, the chimney effect may refer to an induced flow of air through a pathway (e.g., a chimney) between the enclosure and the environment that is induced by an air-density difference between the lower-density warmer air of the enclosure passing through the pathway to the environment while being displaced by the higher-density colder air from the environment.

As used herein, a "free cooling mode" includes a mode of operation in which an air handling sub-system pulls air at least partially from an external source (such as air outside a facility) and forces the air to electronic equipment without active chilling in the air-handling sub-system (e.g., fluid flow through the chiller coils in the air handling sub-system is shut off by closing a flow control valve).

As used herein, "room" means a room or a space of a structure. A "computer room" means a room in which computer systems, such as rack-mounted servers, are operated.

As used herein, "computer system" includes any of various computer systems or components thereof. One example of a computer system is a rack-mounted server. As used herein, the term computer is not limited to just those integrated circuits referred to in the art as a computer, but broadly refers to a processor, a server, a microcontroller, a microcomputer, a programmable logic controller (PLC), an application specific integrated circuit, and other programmable circuits, and these terms are used interchangeably herein. In various embodiments, memory may include, but is not limited to, a computer-readable medium, such as a random access memory (RAM). Alternatively, a compact disc-read only memory (CD-ROM), a magneto-optical disk (MOD), and/or a digital versatile disc (DVD) may also be used. Also, additional input channels may include computer peripherals associated with an operator interface such as a mouse and a keyboard. Alternatively, other computer peripherals may also be used that may include, for example, a scanner. Furthermore, in the some embodiments, additional output channels may include an operator interface monitor and/or a printer.

As used herein, a "damper" includes any device or component that can be moved to control (e.g., increase or decrease) the flow of fluid through a duct, conduit, or other passageway. Examples of dampers include plates, blades, panels, or discs, or any combination thereof. A damper may include multiple elements. For example, a damper may include a series of plates in parallel relation to one another that can be simultaneously rotated to close a duct. As used herein, to "adjust" a damper means to place or leave one or more elements of the damper to achieve desired flow characteristics through the damper, such as open, closed, or partially open. For example, in a system with eighteen passive cooling systems, adjusting the exhaust air dampers may include opening at least some selected exhaust air dampers in eight of the passive cooling systems and keeping at least some exhaust air dampers closed in the other ten passive cooling systems.

In various embodiments, a passive cooling system for a structure facilitates passive cooling of one or more enclosures that has at least one waste heat source by routing exhaust air from the enclosure to an ambient environment through an indirect pathway that precludes environmental elements from entering the enclosure from the ambient environment. Passive cooling may involve one or more cooling systems operating in a free cooling operating mode with regard to one or more waste heat sources. The exhaust air may carry waste heat energy output by one or more waste heat sources in the enclosure, such that the passive cooling system provides cooling to the enclosure by routing waste heat energy out of the enclosure by routing the exhaust air. In some embodiments, a structure includes a data center, and the enclosure includes a computer room having one or more computing systems as waste heat sources.

FIG. 1 is a schematic diagram illustrating a data center that includes a passive cooling system according to one embodiment. In some embodiments, a data center includes one or more computer rooms including computing systems and one or more cooling systems that remove waste heat energy from the computing systems. For example, in the illustrated embodiment, data center 100 includes a computer room 110, a raised-floor cooling system 120 that provides cooling air to the computer room 110, and one or more passive cooling systems 130 that passively route exhaust air from the computer room 110. Computer room 110 includes one or more rack computing systems 112 that each may include one or more computing systems. The computing systems may include one or more waste heat sources that generate waste heat energy during operation which, if not removed from rack computing systems 112, may accumulate and damage the computing systems therein.

In some embodiments, a cooling system may provide cooling air to one or more rack computing systems in a data center to remove waste heat energy from the computing systems therein. For example, in the illustrated embodiment, data center 100 includes a raised-floor cooling system 120 that supplies cooling air 106 to the rack computing systems 112 from a raised-floor plenum 124 beneath a part of the computer room 110. In some embodiments, cooling air may be provided to the raised-floor plenum as intake air via one or more air intakes. For example, in the illustrated embodiment, air handling unit 122 supplies intake air 102 to the raised-floor plenum 124, where the provided intake air 102 is then provided through one or more tiles 114 as cooling air 106. Intake air 102 may be drawn from ambient air, recirculated air, or some combination thereof. In some embodiments, at least some intake air is cooled by a cooling system, which may transfer heat energy from the intake air to a coolant fluid by passing the air through one or more heat exchangers. In some embodiments, Air handling unit 122 includes one or more active air handling devices that induce a flow of air into the raised-floor plenum, including one or more air moving devices, including one or more fans, blowers, etc.

The cooling air 106 may be provided from the raised-floor plenum 124 through one or more floor tiles 114 that include perforations, openings, etc. such that cooling air 106 can pass through the tiles. For example, in the illustrated embodiment, rack computing systems 112 are arranged in computer room 110 into one or more rows of rack computing systems, such that a given aisle between the rack computing systems 105 is a "cold aisle" 105 into which cooling air 106 is provided via one or more tiles 114. The cooling air 106 may pass from the cold aisle 105 through one or more computing systems in the rack computing systems 112 and remove waste heat from one or more waste heat sources therein via one or more various forms of heat transfer. It will be understood that various forms of heat transfer for transferring waste heat energy to cooling air from one or more waste heat sources should be understood to encompass forms of heat transfer known to persons having ordinary skill in the art.

In some embodiments, cooling air 106 that removes waste heat energy from one or more components in a rack computing system 112 is output from the rack computing system 112 as exhaust air. In some embodiments, including the illustrated embodiment where cooling air 106 passes through some or all of a rack computing system 112, the air is output from a rack computing system as exhaust air 107 into a "hot aisle" 109.

Exhaust air output from one or more waste heat sources may be removed from an enclosure to prevent excess buildup of waste heat in the enclosure. In some embodiments, one or more passive cooling systems 130 are used to route the exhaust air out of the enclosure via a chimney effect, wherein air is displaced from an enclosure to another environment due based at least in part on an air flow induced by air-density differences between the enclosure and the another environment. For example, in the illustrated embodiment, exhaust air 107 that has absorbed waste heat from rack computing system 112 may have a lower density than cooling air 106 and air in an ambient environment 140 surrounding the data center 100. Such a density difference may induce a flow of the lower-density exhaust air 107 into the higher-density ambient environment 140 where a pathway between the computer room 110 and the ambient environment 140 is provided. Such an induced flow via the chimney effect may be induced passively, such that active air moving devices, including blowers, fans, etc. are not required to induce the air flow. Such passively induced air flow via the chimney effect may include a free cooling operating mode of one or more cooling systems of an enclosure, where cooling air is not actively chilled. For example, in the illustrated embodiment, a free cooling operating mode with regard to structure 100 may include drawing intake air 102 from an ambient environment 140 and providing such intake air 102 to rack computing systems 112 as cooling air 106, such that cooling air 106 provided to rack computing systems is not actively chilled by one or more heat exchanger apparatuses.

In some embodiments, a passive cooling system enables a flow of exhaust air, induced by the chimney effect, to an ambient environment. For example, in the illustrated embodiment, passive cooling systems 130 are disposed above computer room and provide one or more pathways between the computer room 110 and the ambient environment 140 such that exhaust air 107 output from one or more rack computing systems 112 is induced by the chimney effect to rise through one or more pathways included in the passive cooling system 130 as an exhaust air flow 108 to the ambient environment 140. Such an induced flow 108 of exhaust air may allow waste heat energy to be removed from computer room 110 with reduced or absent usage of active air moving devices. In some embodiments, passive cooling systems 130 are located on a roof 118 of a data center 108, such that the passive cooling systems 130 are located above portions of the computer room 110 and route chimney effect-induced air flows out of the computer room 110 and into the ambient environment 140 via one or more vertically-oriented pathways. For example, in the illustrated embodiment, where exhaust air 107 is output from the rack computing system 112 into a "hot aisle" 109, the exhaust air may be induced by the chimney effect to flow upwards through a passive cooling system 130A located above the hot aisle 109. In another example, also shown in the illustrated embodiment, where exhaust air is output from rack computing system 112 into an exhaust vent 116 above the rack computing system 112, passive cooling system 130B may be located above the exhaust vent 116 so that exhaust air passing into the exhaust vent 116 passes flows through the passive cooling system 130B and into the ambient environment 140 via the chimney effect.

Figure 2:
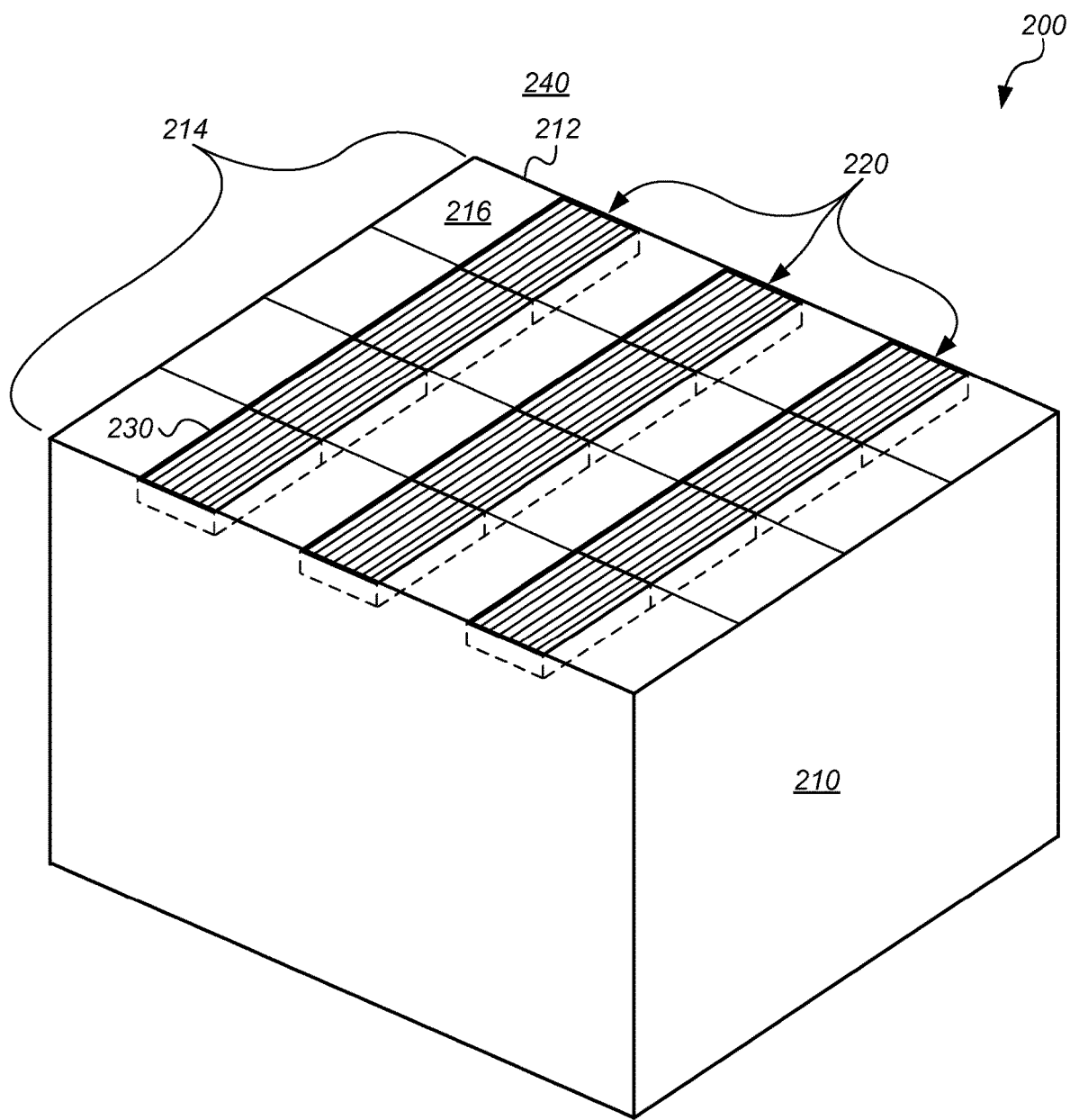
FIG. 2 is a schematic diagram illustrating placement of a passive cooling system on a roof of a structure according to one embodiment.

FIG. 2 is a schematic diagram illustrating placement of a passive cooling system on a roof of a structure according to one embodiment. In some embodiments, one or more passive cooling systems 230 are placed on an upper portion of a structure 200, such that air flows from an enclosure of the structure, through a pathway located in the passive cooling systems to a surrounding ambient environment due to an induced air flow caused by an air density difference between the enclosure and the ambient environment. For example, as shown in the illustrated embodiment, structure 200 may include passive cooling systems 230 that are located on a roof 212 of the structure 200 over an enclosure 210, such that air within the enclosure that is at a lower-density than air in the surrounding ambient environment 240 may be induced to flow upwards, through one or more pathways in the passive cooling systems 230, to the ambient environment 240.

In some embodiments, passive cooling systems are positioned on a structure in a pattern that minimizes structural integrity loss caused by the positioning of the passive cooling systems. For example, in the illustrated embodiment, passive cooling systems 230 that include one or more pathways from the enclosure 210 to the ambient environment 240 may form gaps in the roof 212. Passive cooling systems, if positioned on a structure roof in certain patterns, may compromise structural integrity of various part of a structure, include the roof. Certain positioning patterns of passive cooling systems may minimize such compromises to structural integrity. For example, in the illustrated embodiment, passive cooling systems 230 are positioned on the roof 212 of structure 200 in rows 220. Positioning the passive cooling systems 230 in rows 220 may minimize structural integrity losses induced by the gaps formed from the pathways in the passive cooling systems 230. In addition, in some embodiments, such as where structure 202 is a data center, and enclosure 210 includes a computer room with rows of rack computing systems, the rows 220 of passive cooling systems 230 may be positioned above hot aisles extending alongside the rows of rack computing systems, such that exhaust air output into the hot aisles from the rack computing systems are induced to rise vertically from the hot aisles to the ambient environment 240 via one or more passive cooling systems 230 overhead. In some embodiments, where the rack computing systems output exhaust air into exhaust vents, the rows 220 of passive cooling systems 230 may be positioned above the exhaust vents.

In some embodiments, a structure includes a predefined surface element pattern. For example, as shown in the illustrated embodiment, the roof 212 of structure 200 may include multiple surface elements arranged in a grid-line pattern 214. Each "cell" 216 in the grid 214 may contain one or more elements, including a roofing material, structural element, or the like. In some embodiments, a passive cooling system 230 is disposed at least partially within a given cell 216 of the grid 214. As shown in the illustrated embodiment, for example, each passive cooling system 230 fills an individual cell 216 of the grid 214. In some embodiments, the grid may be configured such that each cell 216 has certain dimensions. For example, each cell 216 may have a standardized size, including 2 feet wide and 4-feet long, and a passive cooling system 230 may have similar dimensions, such that the passive cooling system 230 nearly or completely fills a cell 216. In some embodiments, a passive cooling system may be configured to be removably disposed within a cell 216, such that the passive cooling system 230 may be removed or inserted in a given cell 216.

Figure 3:
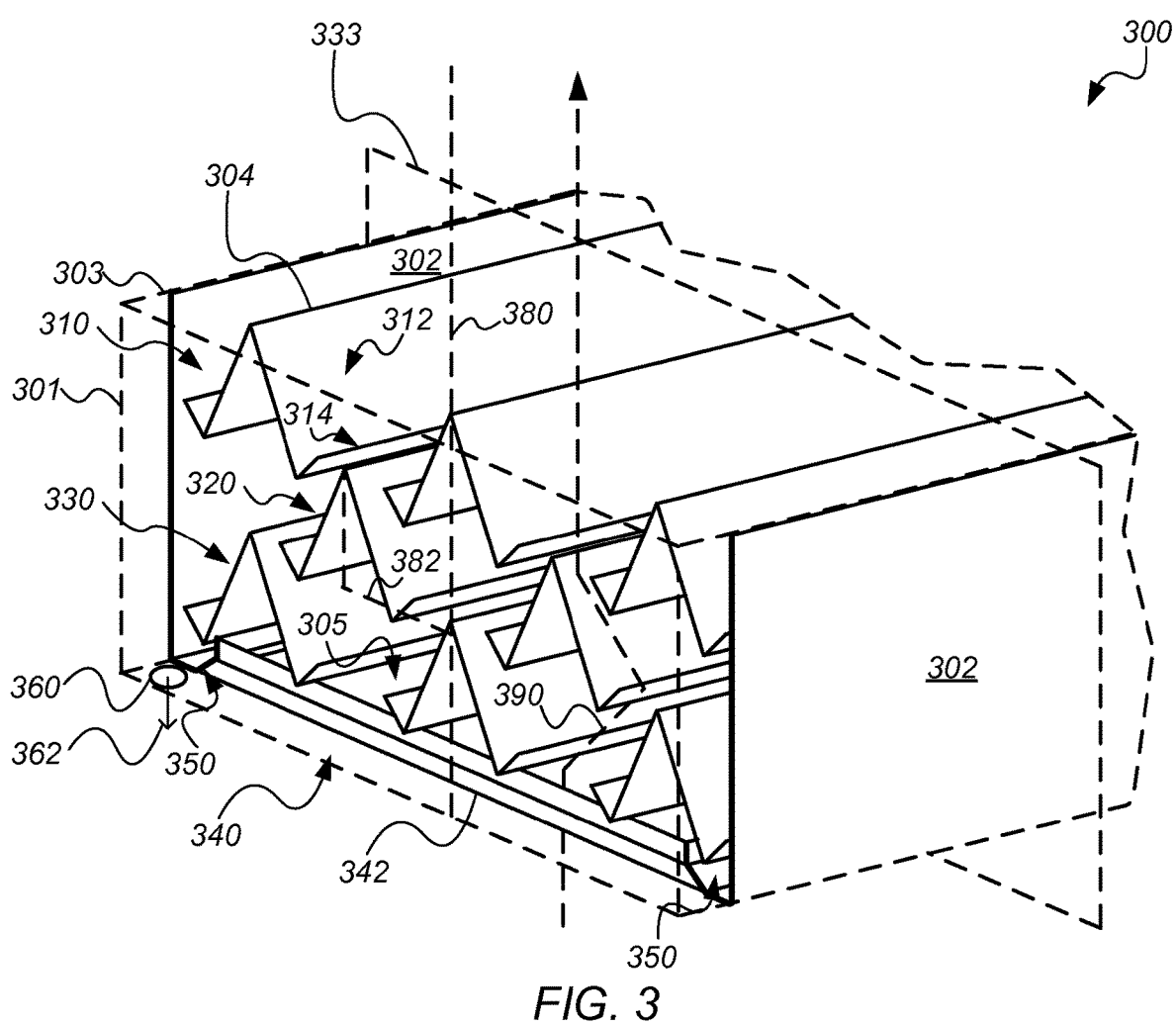
FIG. 3 is a perspective schematic view of a portion of a passive cooling system according to one embodiment.

FIG. 3 is a perspective schematic view of a portion of a passive cooling system according to one embodiment. Passive cooling system 300 includes an internal space 301, which is bordered on at least some sides by side panels 302, and multiple vanes 304 at least partially located ("disposed") within the internal space 301. Internal space 301 includes a top end 303 and a bottom end 305. In some embodiments, top end 303 is an open face of passive cooling system 300 that is configured to be open to an ambient environment above at least a part of the passive cooling system 300. In some embodiments, bottom end 305 is an open face of passive cooling system 300 that is configured to be open to an enclosure of a structure that is beneath at least a part of the passive cooling system 300. In some embodiments, the enclosure of the structure is an upper enclosure over another enclosure that includes one or more waste heat sources. For example, bottom end 305 may be an open face of passive cooling system 300 that is configured to be open to a ceiling plenum that is located above a computer room of a data center.

In some embodiments, the internal space 301 includes a partial enclosure. For example, where internal space 301 is partially bordered by panels 302, such that the internal space is not bound on one or more sides, such as top side 303 and bottom side 305, the internal space 301 includes a partial enclosure.

In some embodiments, internal space 301 includes one or more vanes 304 that are at least partially located within the internal space 301. In some embodiments, the vanes 304 in passive cooling system 300 are arranged to form one or more indirect pathways 390 between an enclosure of a structure and an ambient environment. An indirect pathway can include a pathway between two points that does not follow a straight-line path, including a non-linear pathway. For example, in the illustrated embodiment, an indirect pathway 390 between the bottom end 305 and the top end 303 of the internal space 301 is formed by a horizontally-offset vertical arrangement of rows 310, 320, 330 of vanes 304 in the internal space 301. In some embodiments, including the illustrated embodiment, the vanes 304 are arranged in the internal space 301 such that all pathways between the bottom end 305 and the top end 303 are indirect and no direct pathways between same are present.

For example, as shown in the illustrated embodiments, vanes 304 may be arranged into multiple horizontally-extending rows 310, 320, 330 of vanes 304, where each row is arranged vertically with respect to the other rows. The rows may be additionally arranged so that vanes 304 in each row are horizontally-offset on a vertical axis from vanes in another vertically-adjacent row. Rows may be horizontally-offset from some vertically adjacent rows and horizontally aligned with other rows. For example, in the illustrated embodiment, vanes 304 in row 310 are horizontally offset 382 on a vertical axis 380 from vanes 304 in vertically-adjacent row 320 while being aligned on the vertical axis 380 with vanes 304 in row 330.

In some embodiments, an arrangement of vanes in a passive cooling system that forms indirect pathways between an enclosure beneath the passive cooling system and an ambient environment above the passive cooling system enables air to be routed from the enclosure to the ambient environment, via a chimney effect-induced flow, along one or more of the indirect pathways while precluding various environmental elements from passing from the ambient environment to the enclosure through an interior space. In some embodiments, such routing of air via a chimney effect includes a free cooling operating mode of a cooling system, where cooling air drawn at least in part from an ambient environment is provided to an enclosure without active chilling, and exhaust air is routed from the enclosure to one or more ambient environments. The indirect pathways may cause environmental elements, which may include one or more various precipitations, liquids, particulate matter, or some combination thereof to be re-directed away from entering the enclosure through bottom end 305, or some other part of the internal space 301. For example, as discussed further below in later figures with reference to cross-section 333, vanes 304 may include one or more vane ramps 312 and vane gutters 314 that redirect environmental elements, including fluids received through top end 303 as precipitation, away from passing through bottom end 305. The vane ramps 312 may redirect precipitation entering the internal space 301 through top end 303 to vane gutters 314 which may collect and route the precipitation, at least in part, out of the passive cooling system. In some embodiments, indirect pathways 390 allow precipitation that bypass one or more vanes to be redirected by another vane. For example, as shown in the illustrated embodiment, where a fluid entering internal space 301 through the top end 303 passes between vanes 304 in row 310, the fluid may be redirected by vanes 304 in one or more of rows 320 and 330. As such, the presence of indirect pathways 390 may preclude precipitation entering the internal space 301 through top end 303 from reaching bottom end 305.

In some embodiments, a passive cooling system includes one or more panel gutters that collect and route environmental elements out of the passive cooling system. Panel gutters may be coupled to, and extend at least partially along, an internal face of one or more side panels. For example, in the illustrated embodiment, passive cooling system 300 includes panel gutters 340 and 350, where panel gutters 350 are coupled to inside faces of side panels 302, and panel gutter 340 is coupled to an inside face of a side panel that is not shown in the illustration. In some embodiments, panel gutters 340, 350 route environmental elements, including precipitation, which may further include one or more various liquids, received into the panel gutters 340, 350 out of the passive cooling system 300. For example, as shown in the illustrated embodiment, panel gutters 340, 350 may direct precipitation through aperture 360 such that the precipitation exits 362 the passive cooling system 300. As shown in the illustrated embodiments, panel gutters 340, 350 may be connected such that precipitation may be directed between the panel gutters 340, 350. The panel gutters may be configured to direct precipitation towards the aperture. For example, panel gutters 340, 350 may be angled ("canted") such that a drainage gradient towards aperture 360 is formed and any precipitation received into the panel gutters 340, 350 will flow towards aperture 360. In some embodiments, aperture 360 is positioned on a bottom surface of one or more panel gutters, such as shown in the illustrated embodiment. In some embodiments, one or more apertures 360 may be positioned on another surface of passive cooling system 300, including on one or more panels 302.

In some embodiments, the panel gutters 340, 350 and vanes 304 are configured so that environmental elements are redirected by some part of the vanes 304 into one or more of the panel gutters 340, 350. For example, as shown in the illustrated embodiment, vanes 304 may extend at least partially over a lip 342 of panel gutter 340, such that precipitation redirected along the length of the vanes 304 are routed from one or more of the vane ramps 312 and vane gutters 314 into panel gutter 340. In another example, also shown in the illustrated embodiment, vanes 304 nearest the side panels 302 may be positioned over panel gutters 350 such that any overflow of precipitation from vane gutters 314 falls into the panel gutters 350. In some embodiments, vanes 304 that are at least partially located over panel gutters 350 may be configured such that vane ramps 312 direct precipitation into the panel gutters 350.

Figure 4A:
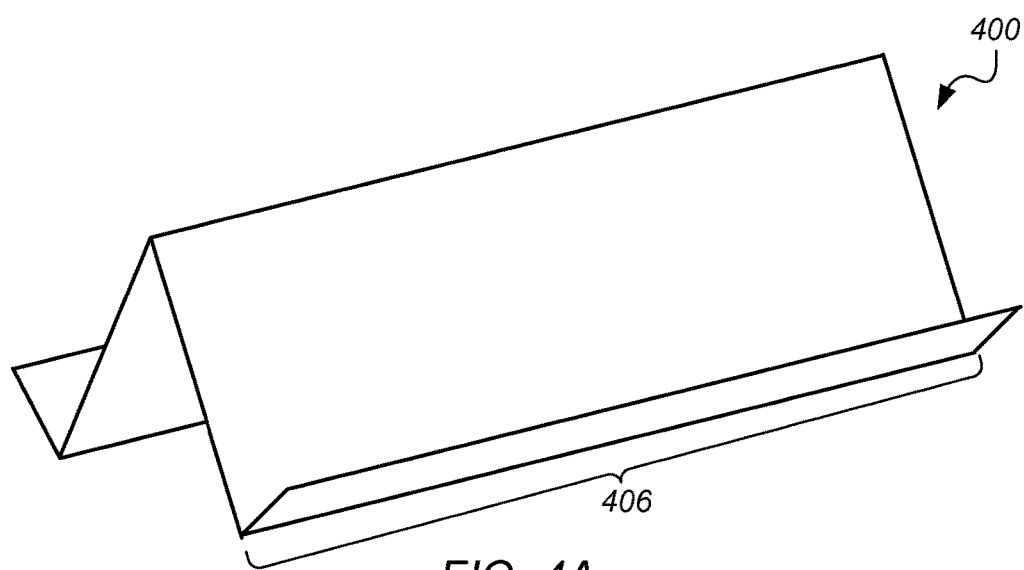
FIG. 4A is a perspective schematic view of a vane of a passive cooling system according to one embodiment.
Figure 4B:
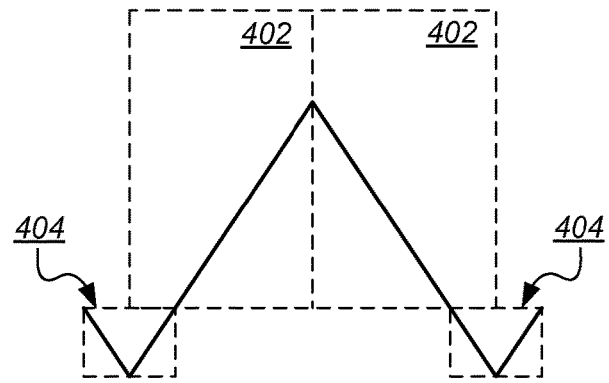
FIG. 4B is a cross-sectional schematic view of a vane of a passive cooling system along a long axis according to one embodiment.
Figure 4C:
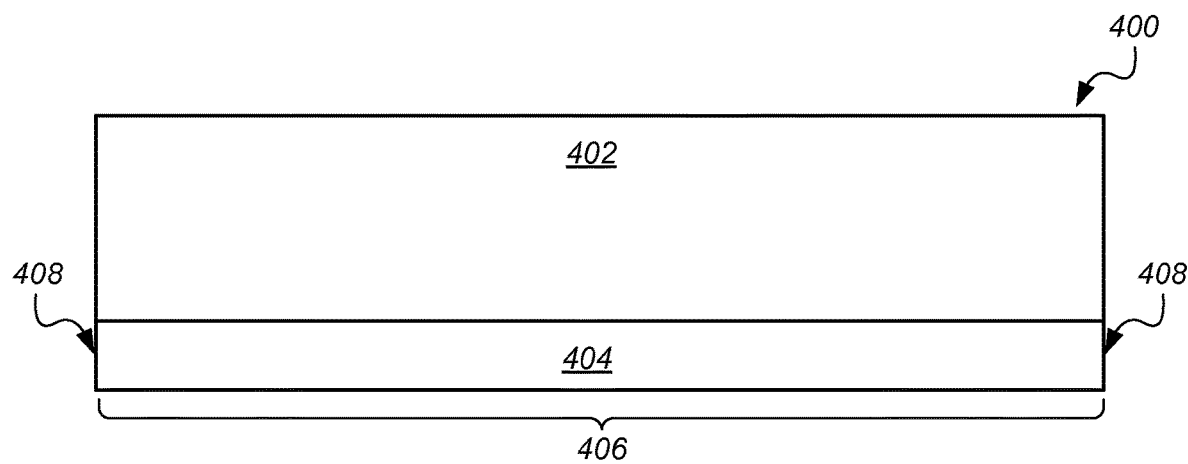
FIG. 4C is an orthogonal schematic view of a vane of a passive cooling system along a short axis according to one embodiment.

FIGS. 4A, 4B, and 4C are various schematic views of a vane 400 of a passive cooling system according to one embodiment. Vane 400 is configured to route air passing through the passive cooling system from an enclosure to an ambient environment along an indirect pathway while routing environmental elements, including precipitation, received from the ambient environment away from the enclosure. A vane in a passive cooling system may include one or more of a vane ramp, a vane gutter, or some combination thereof. For example, as shown in FIG. 4B, vane 400 includes two vane ramps 402 and two vane gutters 404. Vane ramps 402 may include a surface that directs fluid away from a free-fall path, and vane gutters may include one or more trough structure, duct structure, or the like that collects and routes precipitation along its length 406. For example, in the illustrated embodiment, each vane ramp 402 may direct free-falling precipitation received from an ambient environment into one or more vane gutters 404, which collect and route the precipitation along at least a portion of their respective lengths 406. As shown in at least FIG. 4C, vane gutters 404 may have one or more exits 408 at ends of their respective lengths 406, where precipitation routed along a vane gutter 404 may be directed out of the vane gutter 404 through an exit 408. In some embodiments, a vane 400 is configured to route collected precipitation out of an exit 408 and into a panel gutter that further routes the fluid out of the passive cooling system. In some embodiments, the vane 400 is configured to extend at least in part to an exterior of a passive cooling system, such that one or more exits 408 are located on an exterior of the passive cooling system and precipitation is removed from the passive cooling system by passing through the exits 408.

Figure 5A:
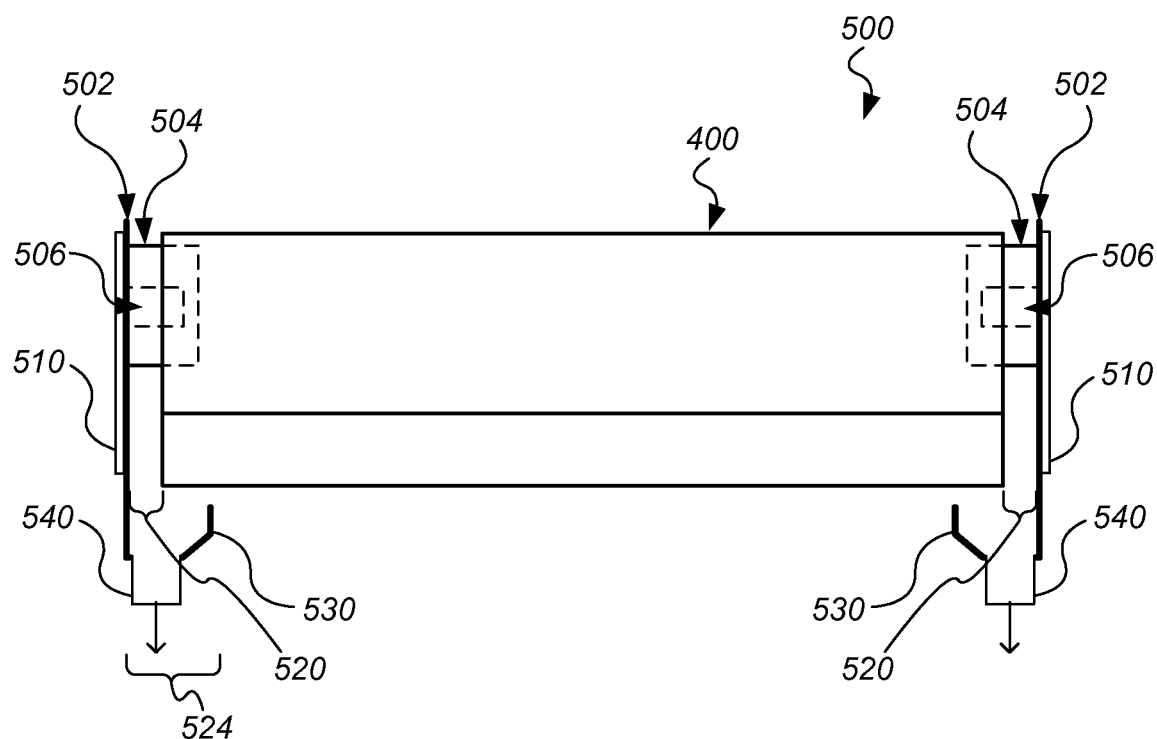
FIG. 5A is an orthogonal schematic view of a passive cooling system including vane supports according to one embodiment.
Figure 5B:
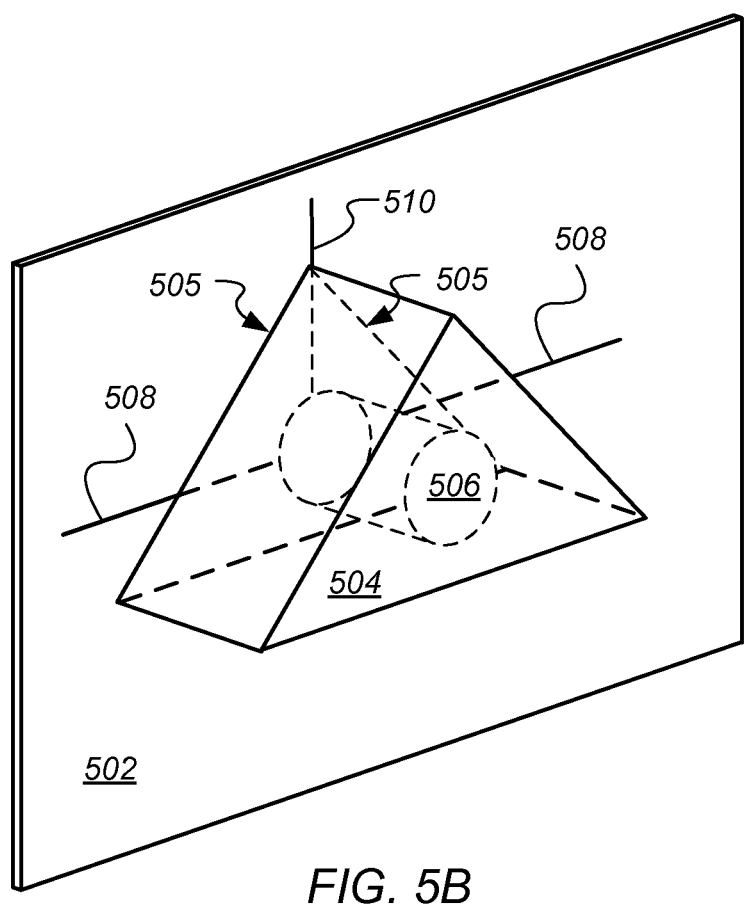
FIG. 5B is a perspective schematic view of a vane support of a passive cooling system according to one embodiment.

FIG. 5A is an orthogonal schematic view of a passive cooling system including vane supports according to one embodiment. FIG. 5B is a perspective schematic view of a vane support of a passive cooling system according to one embodiment. In some embodiments, a passive cooling system includes one or more vane supports that provide structural positioning and support of one or more vanes. For example, in the illustrated embodiment, passive cooling system 500 includes a vane 400, illustrated and discussed further above with reference to FIG. 4A-C, which is supported between two side panels 502 of the passive cooling system 500 by two vane supports 504. In some embodiments, the vane rests upon one or more vane supports and transfers its weight through the vane supports. In some embodiments, the vane is coupled to the vane supports, including via welding, riveting, an adhesive, etc. One or more vane supports may be a separate component from the vane or may be part of the vane.

In some embodiments, the vane supports position one or more vanes in a passive cooling system such that precipitation directed by the vane are directed into a panel gutter via a gap between a part of the gutter and a side panel. The gap may be bridged by a vane support. For example, in the illustrated embodiment, vane 400 rests on two vane supports 504, where the vane 400 is shorter than the distance between the two panels 502 and the vane supports 504 bridge the difference between the lengths, such that a gap 520 is present between an end of the vane 400 and a side panel 502. Precipitation that is routed by one or more vane ramps and vane gutters of the vane 400 through an exit of a vane gutter, as discussed further above with reference to FIGS. 4A-C, may be directed through the gap 520 and into a panel gutter 530, which itself may route the precipitation out of the passive cooling system 500 via one or more apertures 540. In some embodiments, the length of the gap 520 between the vane 400 and the panel 502 is less than the width 524 of the panel gutter 530, such that a part of the vane 400 hangs over the panel gutter, which may reduce the likelihood of precipitation passing through the exit of the vane gutter and missing the panel gutter 530. In some embodiments, the gap is disposed partially or fully within a part of the vane. For example, where a vane is coupled directly to a side panel, the gap may be formed by a hole in the vane, concave shaping of an exit of a vane gutter such that the gap is bounded by the side panel and the concave-shaped exit, or some combination thereof.

In some embodiments, a vane support is configured to follow one or more contours of a part of a vane, such that the vane rests on the vane support with minimal movement. For example, as shown in FIG. 5B, vane support 504 is configured to match the general shape of the underside surface of vane 400, illustrated in FIG. 4A-C. The vane support 504 includes upper surfaces 505 that match the contours of at least part of the underside surfaces of vane 400, so that at least part of the end portions of the undersides of vane 400 rest on the surfaces 505. In some embodiments, the undersides of the vane ramps of a vane 400 rest on surfaces 505. In some embodiments, some portion of a vane 400 is coupled to some part of surfaces 505.

In some embodiments, a vane support adjusts the arrangement of one or more vanes in a passive cooling system. For example, in the illustrated embodiments of FIG. 5A-B, vane support 504 includes one or more motors 506 which operate to move the vane support 504 along one or more tracks 508, 510 on a side panel 502. In some embodiments, various vane supports can be moved independently to adjust a configuration of one or more vanes. For example, with reference to the illustrated embodiment of FIG. 5A, one vane support 504 at one end of vane 400 may be moved in an upwards direction along a track 510 using a motor 506, while another vane support 504 at an opposite end of vane 400 may be moved in a downwards direction along a track 510 using a motor 506, such that vane 400 is angled. In another example, both vane supports 504 may be moved in a common direction by motors 506 along tracks 510, such that the vane 400 is translated in a certain direction, relative to the side panels 502.

In some embodiments, one or more vane supports can be rotatably adjusted. For example, motor 506 may operate to rotate vane support 504 such that a vane 400 resting on surfaces 505 is rotated around its long axis. In another example, motor 506 may operate to rotate vane support 504 such that a vane 400 resting on surfaces 505 is rotated around its short axis In some embodiments, vane support 504 may be adjustable by one or more motors, which may be positioned in various locations. For example, as shown in the illustrated embodiments of FIG. 5A-B, motors 506 may be located at least partially within the vane supports 504. In another example, one or more motors 506 may be located externally to vane supports 504. In some embodiments, a motor 506 may operate to control adjustments to multiple vane supports 504, including rotating adjustments and translating adjustments with reference to the side panel 502.

Figure 6A:
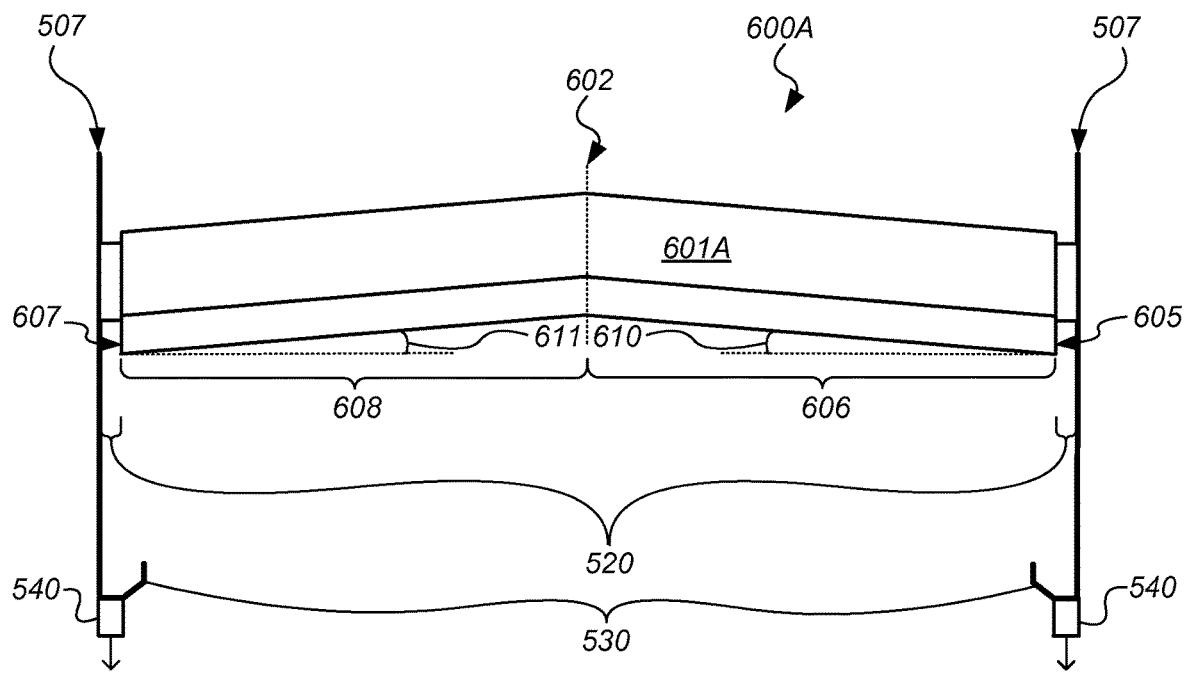
FIG. 6A is an orthogonal schematic view of a passive cooling system including a peaked vane according to one embodiment.

FIG. 6A is an orthogonal schematic view of a passive cooling system including a peaked vane according to one embodiment.

In some embodiments, one or more vanes in a passive cooling system are configured to route environmental elements, including precipitation, in a particular direction along the vane gutters. For example, as shown in the illustrated embodiment of passive cooling system 600A, at least a portion of the vane 601A may be angled 610, 611 such that a drainage gradient is provided along at least a portion of a length of a vane. In some embodiments, a vane may be angled through positioning of vane supports upon which the vane rests, such as discussed above with reference to FIG. 5A-B. In some embodiments, the vane itself may be angled along some or all of its length. For example, in the illustrated embodiment, vane 601A is a "peaked" vane that is configured to be angled differently along its long axis. As shown in the illustration, vane 601A is angled at a certain angle 610 along a portion 606 of its length and is angled at another angle 611 along another portion 608 of its length. In another example, a vane may be a peaked vane that is configured to be angled differently along its short axis. In some embodiments, angles 610 and 611 are equal; in some embodiments the angles 610 and 611 are different. In addition, portions 606 and 608 for a particular vane 601A may be equal or different in length. In some embodiments, the angling 610, 611 of the vane 601A along its length changes at a "peak"

location 602 along the length of the vane 601A. Such split angling of the vane 601A enables precipitation received into the vane gutters of vane 601A to be routed to a respective one of the panel gutters 530 of the passive cooling system 601 through a respective gap 520 at an end of the vane 601A. For example, as shown in the illustrated embodiment, precipitation received into a vane gutter of vane 601A along portion 606 may be directed by angling 610 of the portion 606 into a panel gutter 530 through exit 605 of the vane 601A, and precipitation received into a vane gutter of vane 601A along portion 608 may be directed by angling 611 of the portion 606 into a panel gutter 530 through exit 607 of the vane. In some embodiments, passive cooling systems include one or more exit apertures through which precipitation exit the passive cooling system. For example, in the illustrated embodiment, passive cooling system 600A includes apertures 540 that direct precipitation in respective panel gutters 530 out of the passive cooling system 600A.

In some embodiments, angling a portion of a vane creates a gradient along the portion that influences flow direction of precipitation in a certain one or more directions. Such a gradient may be a drainage gradient that directs precipitation to flow to a particular exit of a vane. For example, in the illustrated embodiment, a drainage gradient along portion 606 may be created by angling 610 of the portion 606, such that precipitation received into the portion 606 of the vane 601A is directed to flow towards exit 605.

Figure 6B:
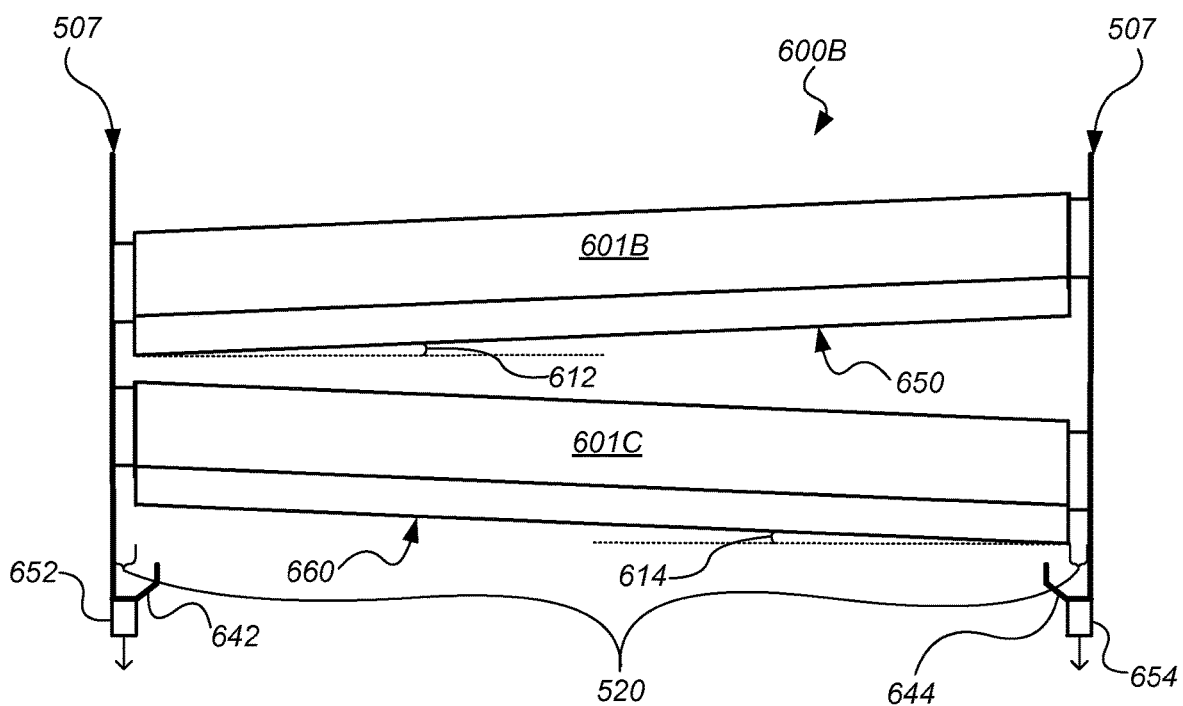
FIG. 6B is an orthogonal schematic view of a passive cooling system including canted vanes according to one embodiment.

FIG. 6B is an orthogonal schematic view of a passive cooling system including angled ("canted") vanes according to one embodiment. In some embodiments, vanes in a passive cooling system may be angled differently, such that precipitation received into the separate vanes are directed differently. The separate vanes may be differently angled to direct precipitation to different panel gutters. For example, in the illustrated embodiment, where vanes 601B and 601C are arranged vertically with respect to each other in passive cooling system 600B, vane 601B is angled 612 to form a gradient such that precipitation received into the vane gutter 650 of vane 601B are directed by the gradient into panel gutter 642 through a gap 520. In contrast, vane 601C is angled 614 to form a gradient such that precipitation received into the vane gutter 660 of vane 601C is directed by the gradient into panel gutter 644 through a gap 520. Passive cooling system 600B includes apertures 652, 654 that direct precipitation in respective panel gutters 642, 644 out of the passive cooling system 600B. In some embodiments, a vane is tapered along at least a portion of its length, which may form a drainage gradient along at least part of the portion of its length.

Figure 7:
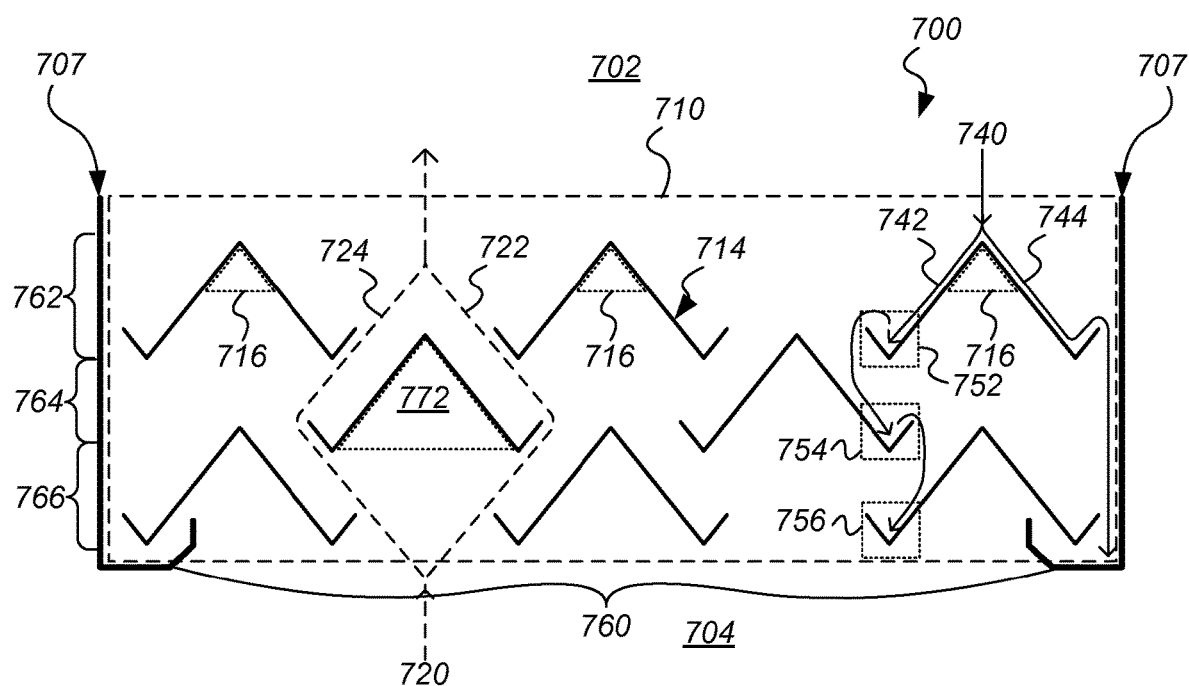
FIG. 7 is a cross-sectional schematic view of a passive cooling system including vane gutters according to one embodiment.

FIG. 7 is a cross-sectional schematic view 700 of a passive cooling system, including vane gutters according to one embodiment. In some embodiments, cross section 700 is a cross section of a portion of a passive cooling system, such as illustrated above with reference to cross-section 333 of FIG. 3. Cross section 700 illustrates a cross section of an internal space 710 that is bounded on sides by side panels 707 and is at least partially open to spaces 702 and 704. For example, internal space 710 is not bounded on a top side by any elements, such that the top side of internal space is open to space 702. In another example, internal space 710 may be partially bounded on a bottom side by panel gutters 760 that are coupled to side panels 707, such that the internal space 710 is partially open to space 704. In some embodiments, space 702 is an ambient environment, and space 704 is an enclosure included in a structure.

In some embodiments, one or more vanes are disposed within the internal space of a passive cooling system. The one or more vanes may be disposed in a particular configuration, such that the one or more vanes direct certain elements along certain pathways formed by one or more of individual vanes, arrangements of various vanes, or some combination thereof. For example, in the illustrated embodiment, vanes 714 are arranged into multiple vertically-arranged rows 762, 764, and 766. Each row of vanes may be horizontally-offset on a vertical axis with respect to one or more other rows of vanes. For example, as shown in the illustrated embodiment, row 764 includes vanes that are horizontally offset from vanes of rows 762 and 766. In some embodiments, an arrangement of vanes may form one or more indirect pathways through the interior space. For example, the horizontal offset of row 764 from rows 762, 766 may form one or more indirect pathways 722, 724 from space 702 and 704 through interior space 710.

In some embodiments, one or more vanes are at least partially supported in a particular position within interior space by one or more vane supports. For example, as shown in the illustrated embodiment, at least some vanes 714 in row 762 are at least partially supported by vane supports 716. A vane may rest upon a vane support, may be coupled to a vane support, or some combination thereof.

In some embodiments, a chimney effect is formed between space 704 and 702 through internal space 710. Such a chimney effect may be caused by differing air densities between at least spaces 702 and 704 and may induce a flow of air through internal space from space 704 to space 702. A chimney effect may induce a vertically-oriented flow of air, such that low-density air rises through a vertically-oriented pathway into a space of higher-density air. In some embodiments, chimney effect-induced air flow through the internal space follows an indirect pathway through internal space 710, which may include a non-linear pathway. For example, as shown in the illustrated embodiment, an air flow 720 from space 704 to space 702 through internal space 710 may follow one or more vertically-oriented indirect pathways 722, 724 through the internal space 710, where the indirect pathway is formed by the arrangement of vanes 714 in the internal space into vertically-arranged, horizontally-offset rows 762-766. In some embodiments, a pathway is vertically oriented if the vertical offset along the pathway is at least greater than the horizontal offset along the pathway. In some embodiments, a pathway is vertically oriented if the vertical offset is greater than the horizontal offset by a predetermined margin.

In some embodiments, one or more vanes 714 entrain at least some air in a pocket 772 formed by one or more vane ramps, vane gutters, etc. A pocket 772 of entrained air may at least partially route air flows along one or more indirect pathways 722, 724 through the internal space 710.

In some embodiments, an arrangement of vanes in an internal space precludes precipitation from passing from space 702 to space 704 by redirecting the precipitation using one or more vanes. For example, as shown in the illustrated embodiment, precipitation 740, which may include one or more various liquids, may be received into internal space 710 from space 702, which may include an ambient environment, and may be directed by a vane ramp of a vane in row 762 along one or more pathways 744, 742. As shown, pathway 744 may direct precipitation into a vane gutter proximate to side panel 707.

In some embodiments, and as shown in the illustrated embodiment, one or more vanes may be arranged in an interior space such that one or more vane gutters is positioned at least partially over a panel gutter, such that overflows of precipitation from the vane gutter falls into the panel gutter. Thus, as shown in the illustrated embodiment, precipitation directed along pathway 744 and overflowing from the vane gutter that is positioned over a panel gutter 760 may be directed into the panel gutter 760.

In some embodiments, an arrangement of vanes in an interior space directs precipitation that bypasses a particular vane into another vane. An arrangement of vanes that forms an indirect pathway may, concurrently with routing chimney effect-induced air flows through the internal space, redirect precipitation received into the internal space using one or more of the vanes, such that precipitation entering the internal space from one particular external space is precluded from passing completely through the internal space and into another particular external space. For example, where a passive cooling system shown by cross section 700 forms an internal space 710 between an ambient environment (space 702) and an internal enclosure of a structure (space 704), the illustrated arrangement of vanes 714 may form indirect pathways that route chimney effect-induced air flows 720 from enclosure 704 to ambient environment 702 while redirecting precipitation 740 received into internal space 710 from ambient environment 702 such that the precipitation 740 is precluded from entering enclosure 704.

In another example, as shown in the illustrated embodiment, where precipitation 740 is directed by a vane in row 762 along pathway 742, the precipitation 740 may be directed to vane gutter 752, where the precipitation may be collected and routed by vane gutter 752 to a point external to the internal space, an exit that directs the precipitation to a panel gutter 760, or some combination thereof. Where precipitation overflows from panel gutter 752, the precipitation may be redirected by a vane in row 764 into another vane gutter 754, which may collect and route the precipitation to another point external to the internal space, another exit that directs the precipitation to a panel gutter 760, or some combination thereof. Where precipitation overflows from panel gutter 754, the precipitation may be redirected by a vane in row 766 into another vane gutter 756, which may collect and route the precipitation to another point external to the internal space, another exit that directs the precipitation to a panel gutter 760, or some combination thereof. In some embodiments, vanes in different rows direct precipitation to a common point external to the internal space, a common exit that directs the precipitation to a common panel gutter 760, or some combination thereof.

In some embodiments, one or more vanes in an internal space have one or more various physical configurations. For example, in the illustrated embodiment, vanes 714 in internal space 710 are at least similar to the vane illustrated and discussed above with reference to FIGS. 4A-C, such that the vanes each include two vane ramps and vane gutters coupled to a respective one of the vane ramps. It will be appreciated, as further illustrated below, that various vane configurations are encompassed by the disclosure.

Figure 8:
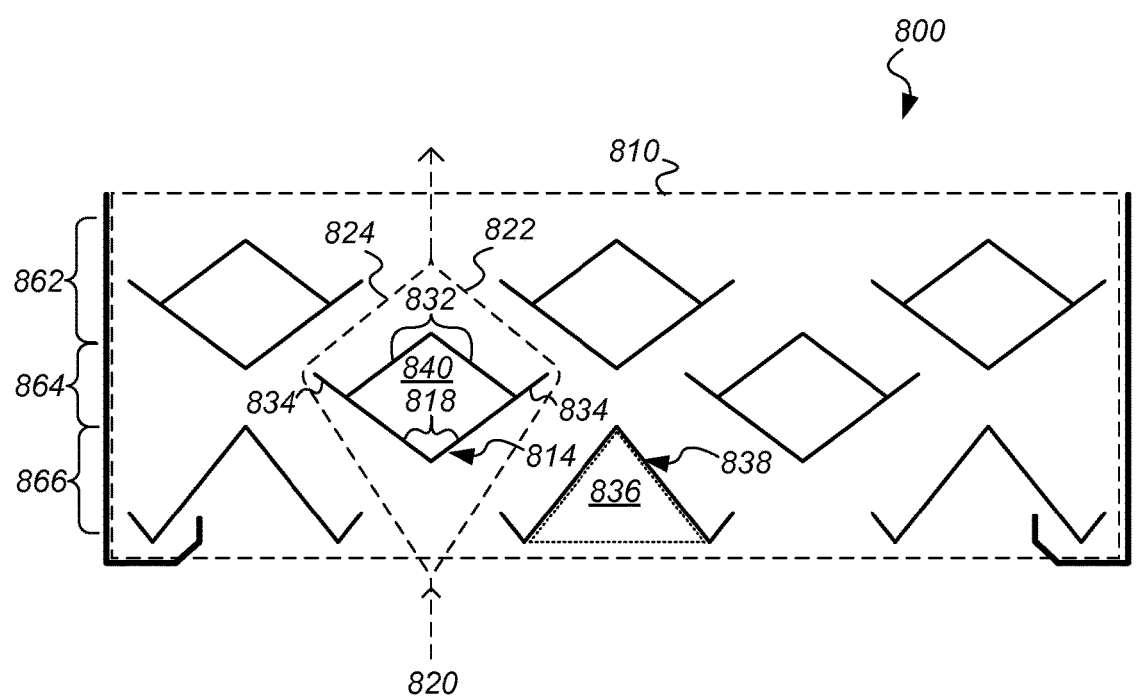
FIG. 8 is a cross-sectional schematic view of a passive cooling system including air routing ramps according to one embodiment.

FIG. 8 is a cross-sectional schematic view 800 of a passive cooling system including air routing ramps according to one embodiment. In some embodiments, cross section 800 is a cross section of a portion of a passive cooling system, such as illustrated above with reference to cross-section 333 of FIG. 3.

In some embodiments, various vanes disposed into an internal space 810 of a passive cooling system have various configurations. Such various configurations may direct air, precipitation, etc., differently from other configurations. For example, as shown in the illustrated embodiment, while row 866 includes vanes having a configuration similar to that illustrated and discussed above with reference to FIG. 7 and FIGS. 4A-C, rows 862 and 864 include vanes of a different configuration. Such vanes 814 may include air routing ramps 818 that direct air along one or more pathways 822, 824 such that the air is precluded from becoming entrained in a pocket. In some embodiments, air routing ramps are coupled to one or more of vane ramps and vane gutters of a vane, such that an enclosure is formed that precludes air passing through internal space 810 from being entrained in a pocket formed by at least part of a vane. For example, in the illustrated embodiment, air routing ramps 818 are coupled to vane gutters 834 such that an enclosure 840 is formed that is bounded by vane ramps 832, vane gutters 834, and air routing ramps 818 that precludes air 820 passing along indirect pathways 822, 824 from being entrained in a pocket formed by any part of vane 814. In contrast, as shown in the illustrated embodiment, a vane 838 lacking air routing ramps may include a partial enclosure bounded by one or more vane ramps, vane gutters, etc., such that a pocket 836 in which air passing through the internal space 810 may become entrained is formed. In some embodiments, a vane configuration entrains some air in a pocket such that air flows are directed by the pocket along an indirect pathway.

Figure 9:
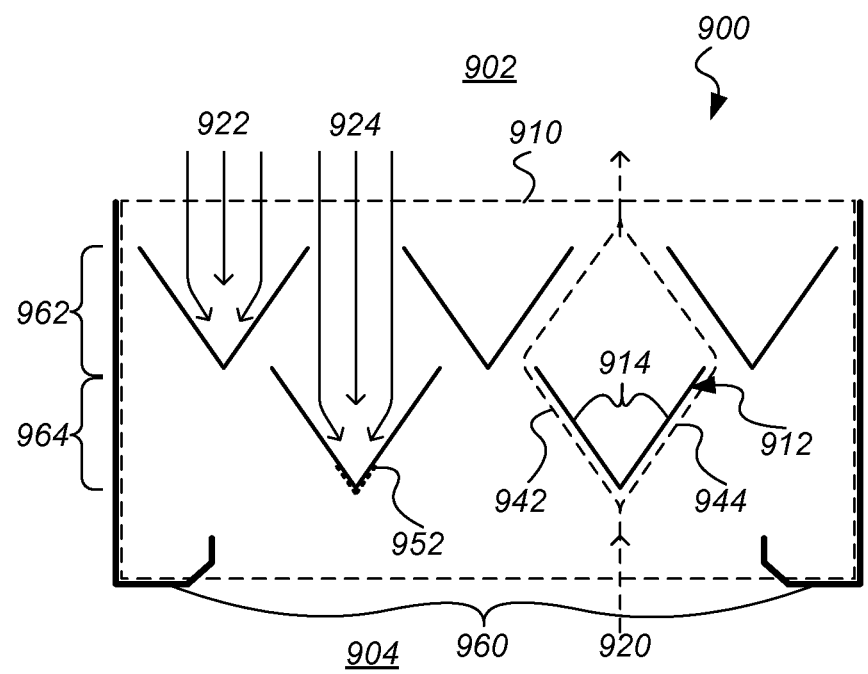
FIG. 9 is a cross-sectional schematic view of a passive cooling system according to one embodiment.

FIG. 9 is a cross-sectional schematic view of a passive cooling system according to one embodiment. In some embodiments, cross section 900 is a cross section of a portion of a passive cooling system, such as illustrated above with reference to cross-section 333 of FIG. 3.

In some embodiments, one or more vanes disposed in an internal space include one or more vane gutters and is free of vane ramps. For example, in the illustrated embodiment, vanes 912 are disposed in vertical, horizontally-offset rows 962, 964 within internal space 910, where each vane 912 includes a vane gutter 914 and is free of vane ramps. In some embodiments, vanes that include one or more vane gutters and are free of vane ramps may direct air along an underside of the vane and may direct precipitation along an upper side of the vane. For example, as shown in the illustrated embodiment, air 920 rising through internal space 910 from space 904 to space 902, that may be a flow induced by a chimney effect, may be directed by an underside of vane 912 along one or more indirect pathways 942, 944, while precipitation 922, 924 received into the internal space 910 from space 902 may be collected by vanes 912 disposed in various rows 962, 964, such that precipitation received from space 902 is routed by one or more vanes 912 to one or more points external to the internal space 910, one or more panel gutters 960, or some combination thereof.

In some embodiments, one or more vane supports are shaped to accommodate a shape of some or all of a vane. For example, in the illustrated embodiment, vane support 952 is shaped to accommodate a portion of the underside of a vane having a shape at least similar to vane 912. It will be understood that vane supports having various shapes, including shapes that partially or fully accommodate a shape of at least a portion of one or more surfaces of one or more vanes is encompassed by the disclosure.

Figure 10:
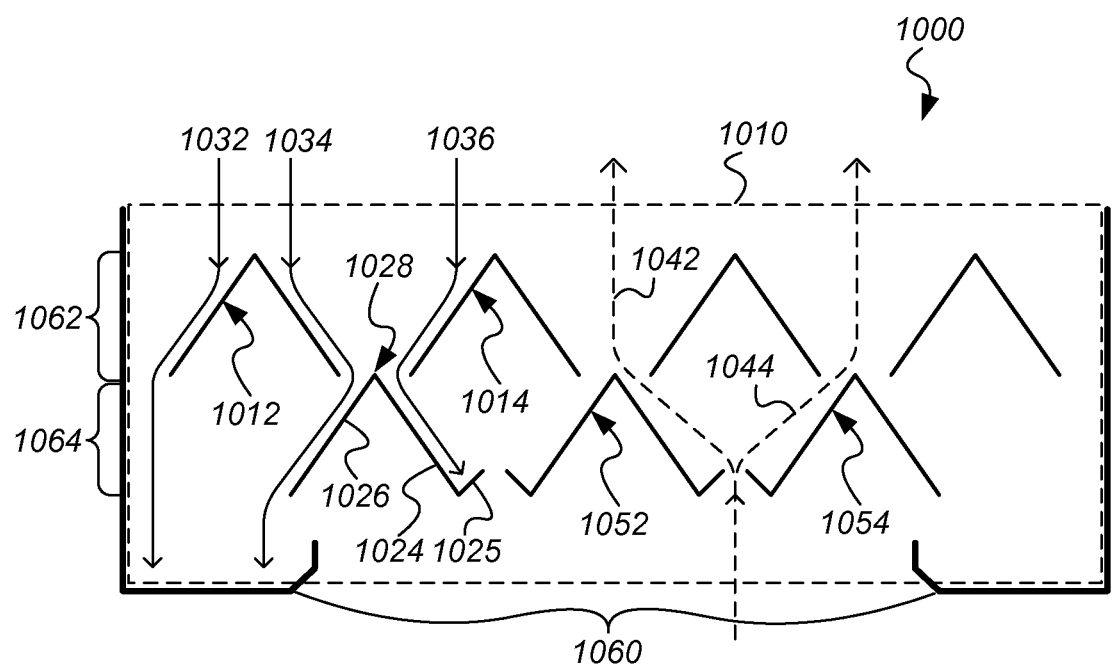
FIG. 10 is a cross-sectional schematic view of a passive cooling system according to one embodiment.

FIG. 10 is a cross-sectional schematic view 1000 of a passive cooling system according to one embodiment. In some embodiments, cross section 1000 is a cross section of a portion of a passive cooling system, such as illustrated above with reference to cross-section 333 of FIG. 3.

In some embodiments, a passive cooling system includes an internal space into which vanes having various configurations are disposed. Various configurations may include one or more vane ramps, vane gutters, or some combination thereof. Where vanes are arranged into various rows, each row may include vanes of one or more various configurations. Particular rows may include vanes having one or more particular configuration based at least in part upon the arrangement of the row with respect to other rows. For example, as shown in the illustrated embodiment, FIG. 10 illustrates a cross-section 1000 of a passive cooling system including two vertically arranged, horizontally-offset rows 1062, 1064 of vanes, where vanes included in the separate rows have one or more separate configurations. As shown in the illustrated embodiment, vanes included in row 1062 may include vane ramps and no vane gutters, such that the vanes in row 1062 redirect precipitation 1032, 1034, and 1036 received into internal space 1010 without collecting any precipitation into a vane gutter. Where a vane includes one or more vane ramps independently of vane gutters, the vane may redirect precipitation to another vane, gutter, etc. For example, precipitation 1032 received into internal space 1010 may be redirected by a vane ramp of vane 1012 into one or more panel gutters 1060, and precipitation 1034, 1036 received into internal space 1010 may be redirected by respective vane ramps of vanes 1012, 1014 to another vane 1028.

In contrast to vanes included in row 1062, vanes in row 1064 may include at least one vane gutter. For example, vane 1028 in row 1064 includes a vane ramp 1026 that is independent of a vane gutter, such that precipitation 1034 directed onto the vane ramp from vane 1012 are directed into one or more panel gutters without being collected by a vane gutter, and further includes a vane ramp 1024 that is coupled to a vane gutter 1025, such that precipitation 1036 directed to vane ramp 1024 from vane 1014 are directed to vane gutter 1025 to be routed along the vane gutter 1025 to a point external to the internal space 1010, one or more panel gutters 1060, or some combination thereof.

In some embodiments, various vanes in a particular row of vanes have one or more various different configurations. For example, as shown in the illustrated embodiment, row 1064 includes vanes 1028, 1052, and 1054, where vanes 1028 and 1054 include mirrored configurations that include two vane ramps and one vane gutter, while vane 1052 includes a configuration similar to a vane illustrated and discussed above with reference to FIG. 4A-C.

Figure 11:
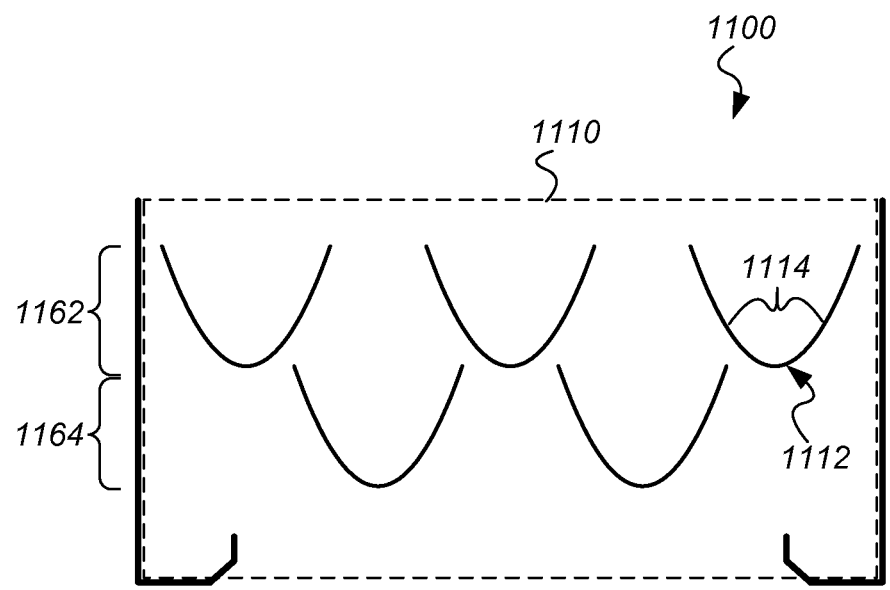
FIG. 11 is a cross-sectional schematic view of a passive cooling system according to one embodiment.

FIG. 11 is a cross-sectional schematic view 1100 of a passive cooling system including vanes having a concave curvature according to one embodiment. In some embodiments, cross section 1100 is a cross section of a portion of a passive cooling system, such as illustrated above with reference to cross-section 333 of FIG. 3.

In some embodiments, a passive cooling system may include one or more vanes that may include one or more curved elements. Curved elements may include one or more surfaces that have a nonlinear curvature, including a convex curvature, concave curvature, etc. For example, as shown in the illustrated embodiment, an internal space 1110 may include one or more rows 1162, 1164 of vanes 1112 having an upward-facing concave curvature 1114. Such a curvature may be formed by a single piece of material. Such a single piece of material may provide the curvature based at least in part upon a molding of the material to the curvature, bending the material to the curvature, or some combination thereof. For example, in the illustrated embodiment, each vane 1112 may be formed of a single piece of material formed into the upward-facing concave curvature, such that each vane 1112 includes a vane gutter formed by the curvature 1114. In some embodiments, one or more vanes include one or more linear elements, including one or more flat, planar surfaces.

Figure 12:
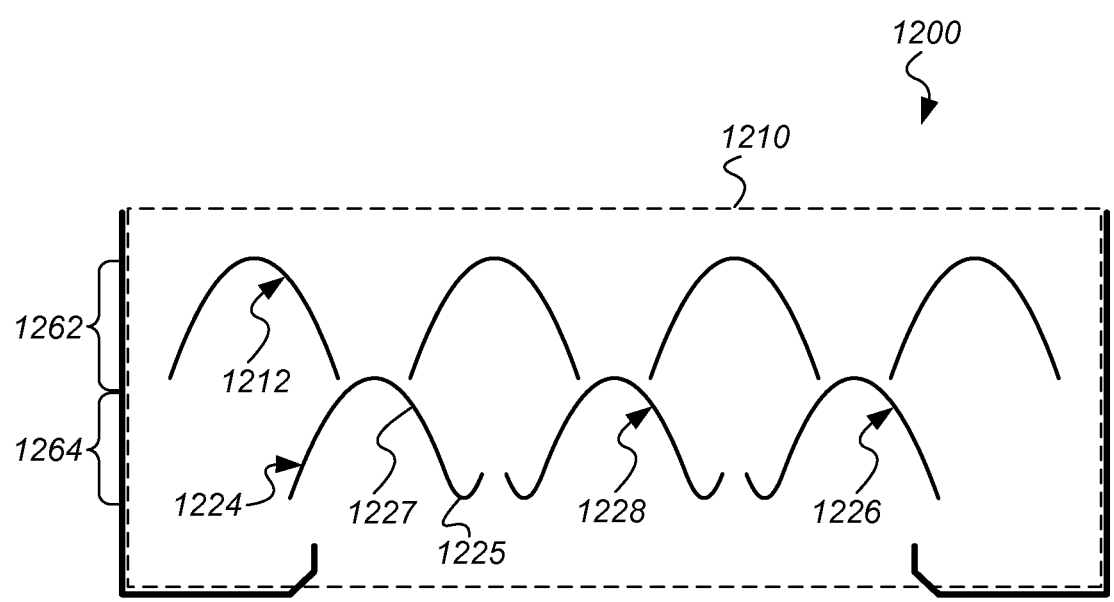
FIG. 12 is a cross-sectional schematic view of a passive cooling system according to one embodiment.

FIG. 12 is a cross-sectional schematic view 1200 of a passive cooling system according to one embodiment. In some embodiments, cross section 1200 is a cross section of a portion of a passive cooling system, such as illustrated above with reference to cross-section 333 of FIG. 3.

As discussed above with reference to FIG. 10, in some embodiments, a passive cooling system includes an internal space into which vanes having various configurations are disposed. As further shown in the illustrated embodiment, one or more vanes in internal space 1210 may have various configurations having various non-linear curvatures. For example, row 1262 may include vanes 1212 each having a downward-facing concave curvature. Such a curvature may be formed by a single piece of material. For example, in the illustrated embodiment, each vane 1212 may be formed of a single piece of material formed into the downward-facing concave curvature, such that each vane 1212 includes one or more vane ramps formed by the curvature.

In contrast to vanes included in row 1062, vanes in row 1264 may include at least one vane gutter. Such an inclusion of various numbers of vane ramps and vane gutters in a vane may be implemented by a varying curvature of a piece of material, such that one or more vane ramps and vane gutters are formed by differing curvatures of the material. For example, in the illustrated embodiment, vane 1224 in row 1264 may include a single piece of material that includes a downward-facing concave curvature 1227 that forms one or more vane ramps and an upward-facing concave curvature 1225 that forms one or more vane gutters. A single piece of material may have varying curvatures based at least in part upon one or more various processes, such as discussed above with reference to FIG. 11. In some embodiments, vane 1224 may be formed of various pieces of material, including pieces having different curvatures.

As discussed above, in some embodiments, one or more rows of vanes may include vanes having various configurations. For example, as shown in the illustrated embodiment, row 1264 may include vane 1224 having the above-discussed configuration including at least two separate curvatures, a vane 1226 having a mirrored configuration to vane 1224, and one or more vanes 1228 having a configuration including one or more downward-facing concave curvatures and two or more upwards-facing concave curvatures, such that the vane 1228 includes at least two vane ramps and two vane gutters.

Figure 13:
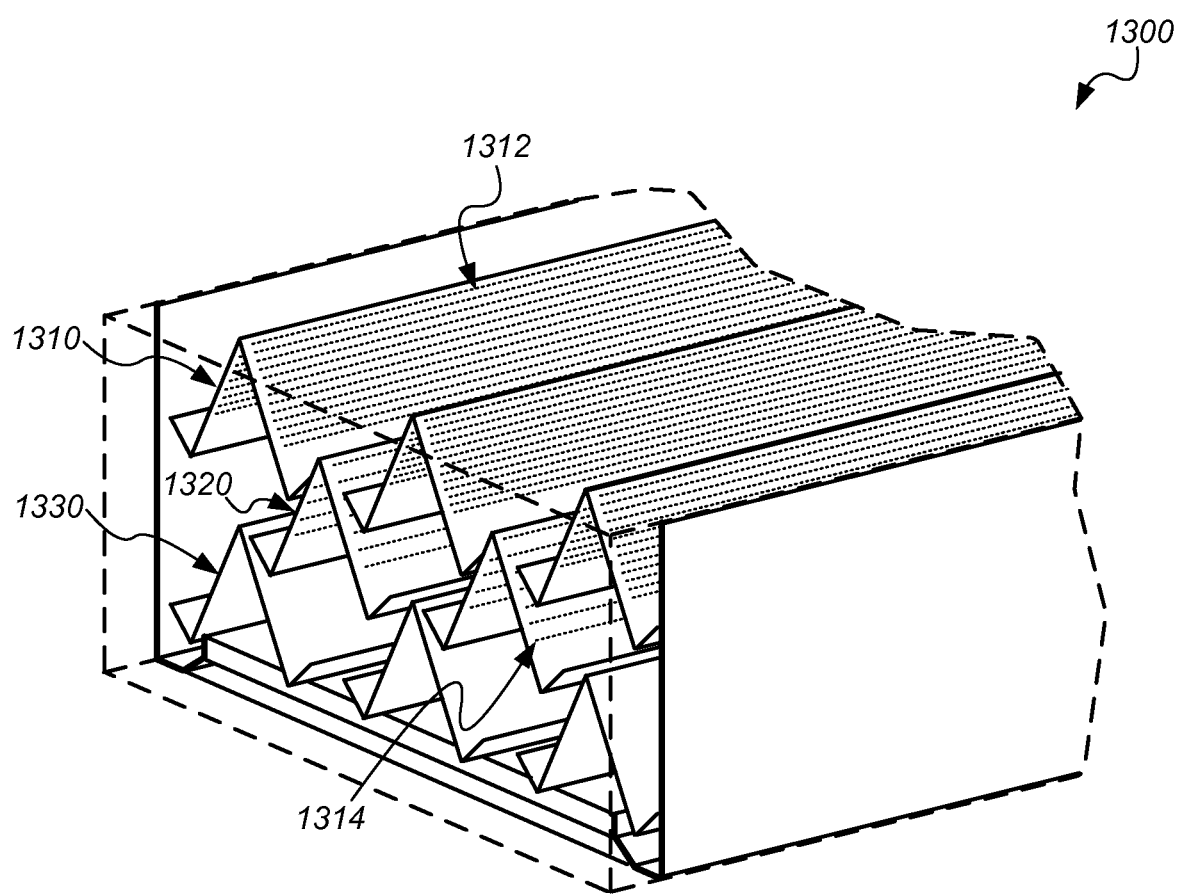
FIG. 13 is a perspective schematic view of a passive cooling system including perforated vanes according to one embodiment.

FIG. 13 is a perspective schematic view of a portion of a passive cooling system including perforated vanes according to one embodiment.

In some embodiments, one or more vanes in a passive cooling system include one or more perforations on one or more surfaces. Perforations in a surface of a vane may communicate various precipitations between various surfaces of a vane, including communicating some or all of precipitation received on a particular surface of the vane through the vane. Various vanes in a passive cooling system may have different amounts and arrangements of vanes. Perforations in one or more vanes may enable the vane to direct some of the precipitation received to a surface of the vane to one or more vane gutters of the vane, while communicating a portion of the received precipitation through the vane to be received on to a surface of another vane. Such a vane may reduce the amount of precipitation handled by any given vane to within a certain threshold. For example, where a vane includes a vane gutter capable of directing no more than a certain threshold amount of fluid without overflowing, the vane may include one or more arrangements of perforations on one or more surfaces, including a surface of one or more vane ramps, to communicate some of the precipitation received on to the surface through the vane to be received on to a surface of another vane, such that the other vane directs at least a portion of the communicated precipitation.

For example, as shown in the illustrated embodiment, passive cooling system 1300 may include various rows 1310, 1320, 1330 of vanes, where one or more rows of vanes includes vanes with various arrangements of perforations. As shown, a top row 1310 of vanes may include a particular arrangement of perforations 1312 that communicate a portion of precipitation received on to a surface of the vanes through the vanes to one or more vanes on a lower row 1320, 1330. As further shown in the illustrated embodiment, perforations may be included on a portion of one or more vane ramps. In some embodiments, perforations may be included on a portion of one or more vane gutters.

In some embodiments, various rows of vanes may include various arrangements of perforations, such that vanes in rows proximate to one end of a passive cooling system have a greater amount of perforations than vanes in rows proximate to another end of the passive cooling system. For example, as shown in the illustrated embodiment, while row 1310, which is proximate to a top end of the passive cooling system 1300, may include an arrangement of perforations 1312 on one or more surfaces of the vanes, row 1320 may include vanes having another arrangement of perforations 1314 that includes a reduced amount of perforations with respect to the arrangement of perforations 1312 in the vanes of row 1310. In addition, row 1330 may include vanes that are free from perforations. In some embodiments, variation of amount, size, etc. of some or all perforations across various rows of vanes may follow one or more relationships, including a geometric relationship, power relationship, etc. For example, the perforations 1312 in vanes of row 1310 may communicate twice as much fluid as the perforations 1314 in vanes of row 1320. Such difference in communication may be based at least in part on differing quantity, size, shape, arrangement, etc. of perforations on various vanes.

In some embodiments, arrangement of perforations may vary across rows of vanes to maintain a threshold level of precipitation directed to vane gutters on a given vane of one or more rows. For example, in the illustrated embodiment, where precipitation may be received into passive cooling system from a top end proximate to row 1310, vanes in row 1310 may include an arrangement of perforations 1312 that communicate a portion of received precipitation to one or more following rows of vanes 1320, 1330, such that a quantity of precipitation directed to vane gutters in vanes of row 1310 remains within a certain threshold level. Such a threshold level may be predetermined, such as a maximum fluid capacity of one or more vane gutters on one or more vanes of row 1310.

In the illustrated example, where precipitation that either bypasses row 1310 of vanes, is communicated through same by perforations 1312, etc. is at least partially received onto one or more surfaces of the vanes of row 1320, such vanes may include another arrangement of perforations 1314 that communicate a portion of the received precipitation through the vanes to vanes on row 1330, such that a quantity of precipitation directed to vane gutters in vanes of row 1320 remains within a certain threshold level. The arrangement of perforations 1314 may communicate a reduced amount of precipitation with respect to the arrangement of perforations 1312, such that a larger portion of precipitation received on a surface of the vanes of row 1320 is directed to vane gutters.

In the illustrated example, where precipitation that either bypasses rows 1310, 1320 of vanes, is communicated through same by perforations 1312, 1314, etc. is at least partially received onto one or more surfaces of the vanes of row 1330, such vanes may be free from perforations, such all precipitation received thereon is directed to vane gutters in vanes of row 1330. The vanes of rows 1310, 1320 may direct sufficient quantities of precipitation to vane gutters on the respective rows 1310, 1320, such that the maximum quantity of precipitation that is received onto surfaces of vanes in row 1330 are projected, with a certain predetermined level of confidence, to remain within a threshold level.

Figure 14:
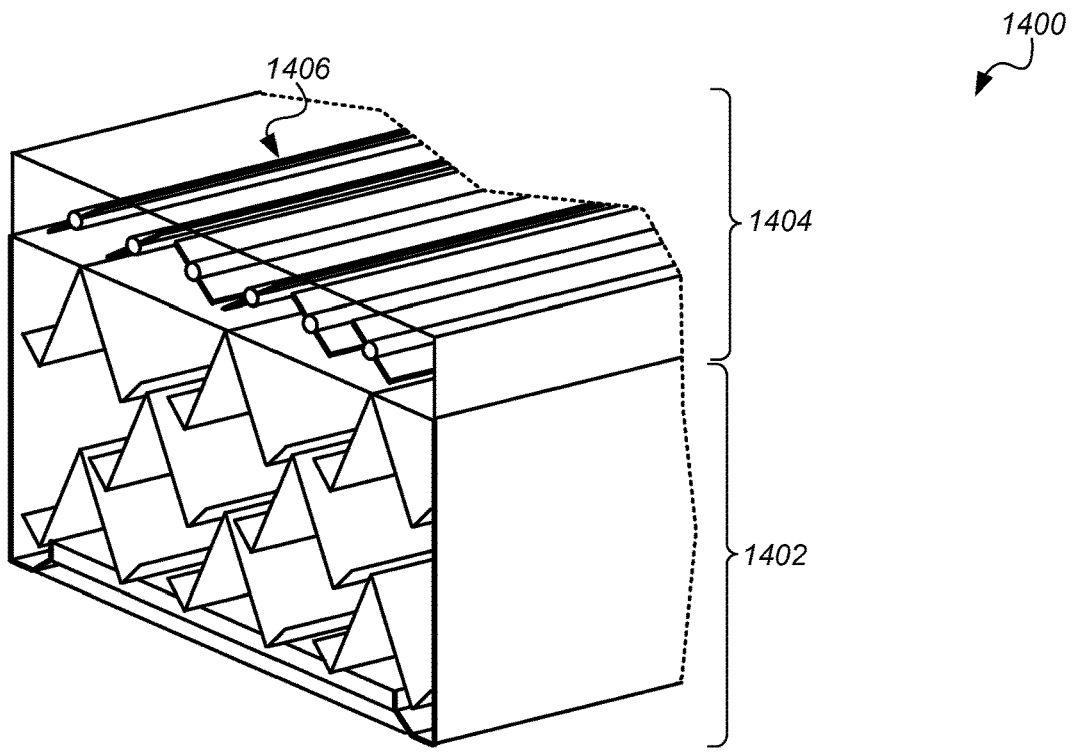
FIG. 14 is a perspective schematic view of a passive cooling system with associated flush dampers according to one embodiment.

FIG. 14 is a perspective schematic view of a passive cooling system with associated flush dampers according to one embodiment.

In some embodiments, dampers may be used, at least in part, to at least partially restrict one or more pathways through an internal space of one or more passive cooling systems. Pathway restriction may be implemented for various reasons. In some embodiments, a pathway through an internal space of a passive cooling system may be restricted by one or more dampers to at least partially restrict exhaust air from flowing through the internal space. A set of one or more dampers may be positioned proximate to one or more various ends of an internal space of a passive cooling system, at least partially within the internal space, or some combination thereof, such that the set of one or more dampers is associated with the passive cooling system.

As an example, as shown in the illustrated embodiment, a system 1400 may include a set 1404 of exhaust dampers 1406 positioned above a top end of an associated passive cooling system 1402, described above in greater detail with reference to at least FIG. 3. In some embodiments, a damper system may be arranged flush with one or more sides of a passive cooling system. For example, in the illustrated embodiment, the damper system 1404 of dampers 1406 may be arranged flush with a side of passive cooling system 1402, such that no gap lies between the damper system 1404 and the passive cooling system 1402. The exhaust dampers may be adjustable, individually or at least partially collectively, to one or more various configurations that at least partially restrict one or more various pathways through the passive cooling system 1402, such that a flow of exhaust air through the passive cooling system is at least partially restricted. As discussed below in greater detail, dampers 1406 may be adjusted to at least partially recirculate exhaust air through at least part of a structure, adjust one or more parameters of air within an enclosure, etc. For example, one or more dampers 1406 may be adjusted, restricting one or more pathways through passive cooling system 1402, to increase air pressure within an enclosure.

In some embodiments, where environmental elements received into an internal space of a passive cooling system from an ambient environment may exceed a threshold capability of the passive cooling system to route the environmental elements away from an enclosure beneath the passive cooling system, one or more dampers may be adjusted to restrict such environmental elements from entering the internal space. Such adjustment may be in response to a determination that environmental elements are entering a passive cooling system at a rate that exceeds a predetermined threshold, a projection of same within a certain time period, etc. For example, in the illustrated embodiment, the dampers 1406 may be adjusted to at least partially restrict the magnitude of environmental elements, including a volume of precipitation, that is received into an internal space of passive cooling system 1402, such that the amount of environmental elements that are so received is projected to not exceed a predetermined threshold, including a predetermined maximum quantity of precipitation that can be routed by the various gutters in the passive cooling system 1402 over a certain period of time.

In some embodiments, one or more dampers may be adjusted to preclude environmental elements from being received into an internal space of a passive cooling system to prevent the environmental elements from incurring damage. For example, where environmental elements include snow, hail, sand, ash, particulate matter, etc., one or more dampers 1406 may be adjusted to prevent such environmental elements from entering at least part of passive cooling system 1402.

Figure 15:
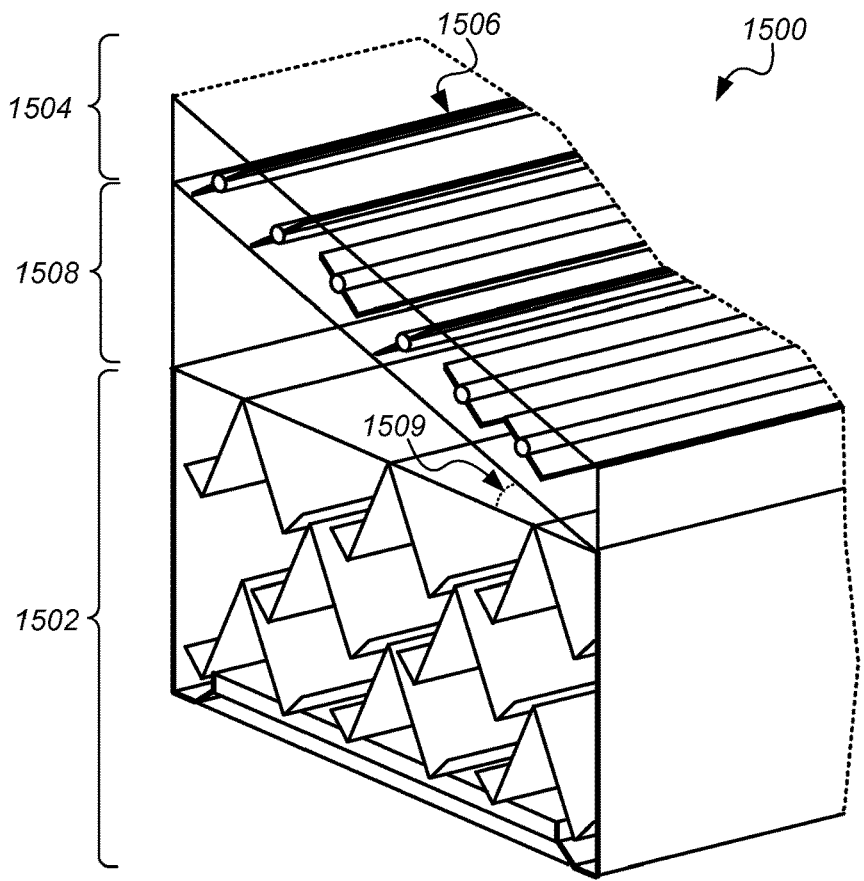
FIG. 15 is a perspective schematic view of a passive cooling system with associated canted dampers according to one embodiment.

FIG. 15 is a perspective schematic view of a passive cooling system with associated canted dampers according to one embodiment.

In some embodiments, at least part of a damper system associated with a passive cooling system may be angled ("canted") with respect to the passive cooling system. For example, in the illustrated embodiment, a system 1500 may include a damper system 1504 of dampers 1506 that may be positioned above a top end of an associated passive cooling system 1502 at an angle 1509, such that an intermediate space 1508 lies between the damper system 1504 and the passive cooling system 1502. Angling of a damper system may at least preclude environmental elements from entering at least part of the passive cooling system, accumulating on one or more surface, or some combination thereof. For example, where environmental elements include snow, hail, sand, ash, particulate matter, one or more precipitations, liquids, etc., an angled damper system may, based at least in part upon one or more configurations of the dampers, direct the environmental elements to flow, settle, slough, etc., down a side of the damper system 1504 of dampers 1506 such that the environmental elements do not accumulate on the dampers 1506. Such directing of environmental elements by an angled damper system may preclude damage to some or all of a passive cooling system by buildup of environmental elements that may impose stress due to weight, erode structural elements, etc.

In some embodiments, one or more dampers may be controlled by one or more control systems, which may command one or more motors to adjust one or more dampers in one or more damper systems.

Figure 16:
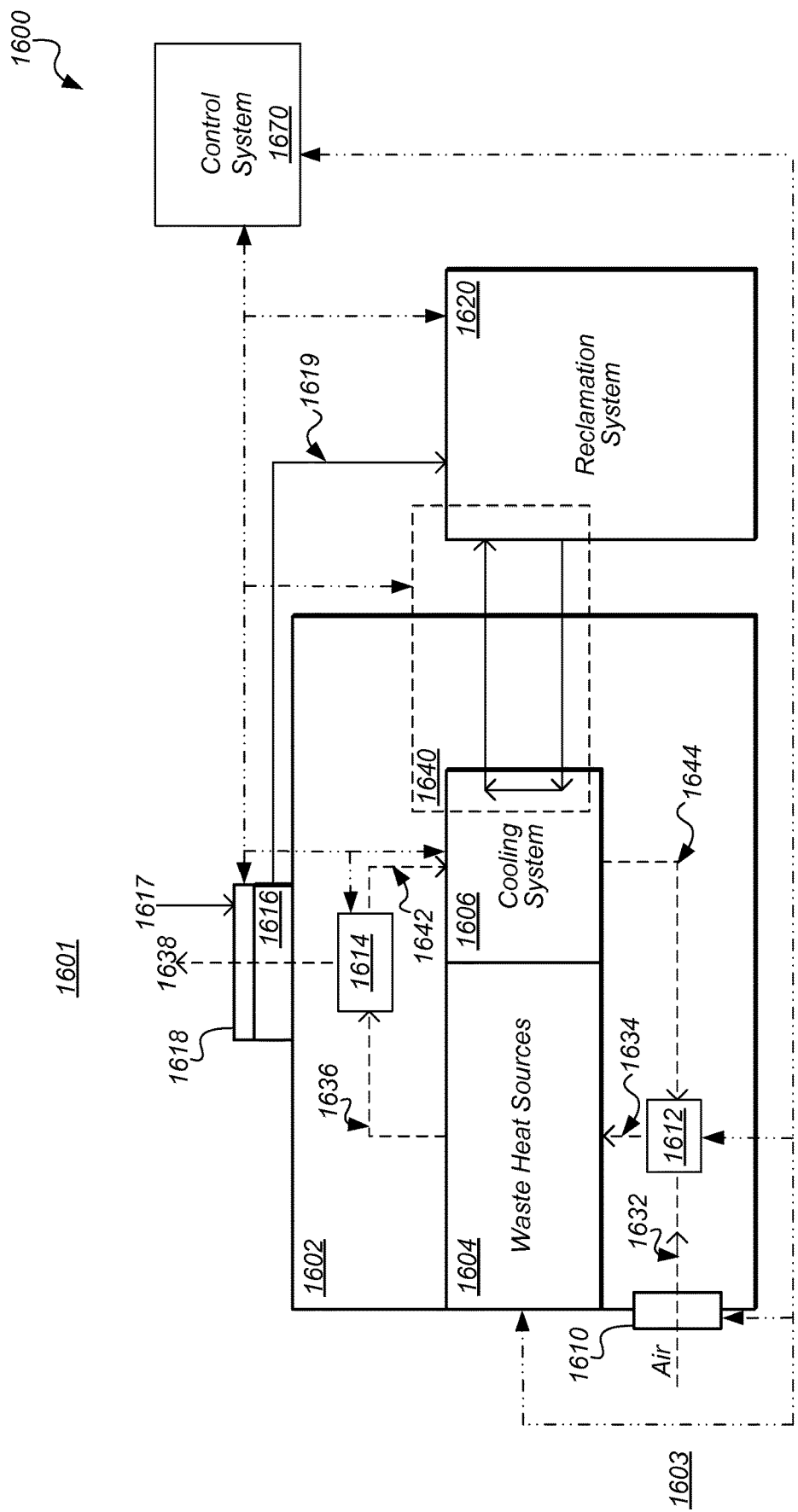
FIG. 16 is a schematic diagram of a heat-generating system including a passive cooling system according to one embodiment.

FIG. 16 is a schematic diagram of a heat-generating system including a passive cooling system according to one embodiment. System 1600 may include one or more elements that remove heat from waste heat sources 1604 in an enclosure 1602, including passive cooling system 1616, which may route a chimney effect-induced flow of exhaust air from the enclosure 1602 to an ambient environment 1601 via one or more pathways in the passive cooling system 1616.

The number of passive cooling systems 1616 in system 1600 may vary. In some embodiments, cross-over ducts may be provided (e.g., on the supply side, the return side, or both) in system 1600 to allow air to be distributed and/or redirected within one or more enclosures. Air handling subsystems may be commonly controlled, separately controlled, or a combination thereof by one or more control systems. For example, in the illustrated embodiments, various subsystems in system 1600 may be controlled, at least in part by a control system 1670, which may be located locally to enclosure 1602, remotely, or some combination thereof. Control system may be implemented, at least in part by some or all of one or more computer systems.

In some embodiments, some or all exhaust air 1636 from one or more waste heat sources 1604 is directed to the ambient environment 1601 as an exhaust flow 1638 through one or more passive cooling systems 1616.

In some embodiments, it may be undesirable to route exhaust air to the ambient environment 1601. For example, ambient environment 1601 may be at a higher temperature than exhaust air 1638, such that an open pathway through passive cooling system 1616 may introduce additional heat to enclosure 1602. In another example, inclement weather may necessitate restricting a pathway between enclosure 1602 and ambient environment 1601 to prevent environmental elements from entering the enclosure 1602 and damaging various systems. One or more damper systems may control the flow 1638 of exhaust air to the ambient environment 1601, such that at least some exhaust air is recirculated within the enclosure 1602. For example, one or more of exhaust dampers 1618 and recirculation dampers 1614 may be adjusted, based at least in part upon commands by control system 1670, to adjust the air flow 1638. A portion of exhaust air 1636 that is not routed to the ambient environment 1601 may be recirculated 1642 within the enclosure 1602. In some embodiments, the exhaust air that is recirculated 1642 is routed to a cooling system 1606 that cools the recirculated air 1642 into cooling air 1644.

In some embodiments, at least a portion of waste heat sources 1604 are provided with cooling air 1634 received as intake air 1632 from an ambient environment 1603 via one or more intake air dampers 1610. Cooling air may include at least some recirculated air 1644, which may be mixed with intake air 1632 via mixing air damper 1612. In some embodiments, one or more of mixing air damper 1612, intake air damper 1610 may be adjusted by control system 1670 to adjust the amount of intake air 1632 mixed with cooled recirculated air 1644.

Cooling system 1606 may be coupled with a coolant loop 1640 and reclamation system 1620. Cooling system 1606 may include one or more heat exchangers that transfer heat from recirculated air to coolant passing through the coolant loop 1640, thereby cooling the recirculated air 1642 into recirculated cooling air 1644.

Coolant loop 1640 is coupled in heat transfer communication with recirculated air 1642 that enters cooling system 1606. A flow of coolant through the coolant loop 1640 may be controlled based at least in part on signals from control system 1670. The flow of coolant may be adjusted to regulate the use of coolant to cool air 1642. In some embodiments, the coolant includes water.

Cooling system 1606 may include an air-conditioning sub-system. In another embodiment, cooling system 1606 may include a cooling tower sub-system. In still another embodiment, cooling system 1606 may include a service water sub-system. In certain embodiments, a mechanical cooling system such as an air-conditioning refrigerant system may be in direct heat transfer communication with recirculated air 1642 air in cooling system 1606.

Control system 1670 may be programmed to control one or more devices in system 1600 to facilitate removal of waste heat from one or more waste heat sources 1604. For example, in the illustrated embodiment, control system 1670 is coupled to intake air damper 1610, mixing air damper 1612, waste heat sources 1604, recirculation damper 1614, exhaust damper 1618, cooling system 1606, coolant loop 1640, and reclamation system 1620. Control system 1670 may be in data communication with temperature sensors, humidity sensors, pressures sensors, or some combination thereof. In some embodiments, devices in system 1600 may be controlled automatically, manually, or some combination thereof.

In certain embodiments, control system 1670, among other things, opens and closes one or more dampers in system 1600 based upon command signals from an operator to channel air flow through enclosure 1602 as necessary for the prevailing operational conditions. Alternatively, the control system 1670 may modulate some or all of one or more dampers between fully open and fully closed positions to modulate airflow through various elements.

In various embodiments, operation of one or more elements of system 1600 may be controlled in response to one or more conditions. For example, the control system 1670 may be programmed to switch the air source for cooling air 1634 from recirculated cooling air 1644 air to intake air 1632 when one or more predetermined conditions are met, such as ambient temperature and humidity in ambient environment 1603.

In various embodiments, a system 1600 may be operated in two or more different cooling modes. The mode of operation at any given time may be selected based on characteristics of the ambient air, characteristics of air in various locations in the system 1600, and other characteristics prevailing at or near the enclosure. In various embodiments, the system 1600 may operate in various cooling operating modes at various times to minimize the amount of energy required to cool the enclosure 1602. Operating in various cooling operating modes may allow for a more efficient use of elements, allow for a reduction is size/capacity of one or more elements of a cooling system 1606, reduce operating costs of the system 1600, and/or improve cooling effectiveness (such as through lower operating temperatures of waste heat sources 1604).

In some embodiments, a cooling system 1606 includes an adiabatic system and a mechanical cooling section. The adiabatic system may be, for example, a direct evaporative cooler in cooling system 1606 that includes a wetted media. The mechanical cooling system may be, for example, an air-conditioning refrigerant system in cooling system 1606. The adiabatic system and mechanical system may be selectively employed and adjusted based on established control conditions. The mechanical cooling system may cool the recirculated air 1642 directly, indirectly (e.g., by chilling water that has been circulated through a coolant loop 1640), or a combination thereof. In certain embodiments, a cooling system 1606 may include an evaporative cooling system (direct or indirect) upstream from a mechanical cooling system in lieu of, or in addition to, an evaporative cooling system (direct or indirect) downstream from the mechanical system.

In some embodiments, coolant used in coolant loop 1640 is one or more fluids routed from passive cooling system 1616 to a reclamation system 1620. As discussed above in greater detail, a passive cooling system may route environmental elements, including precipitation, that are received into an internal space of the passive cooling system to an exit from the passive cooling system. In some embodiments, precipitation, including water, which is received at least partially into an internal space of a passive cooling system, is routed to a reclamation system 1620 via one or more pathways 1619, such that the precipitation is used at least in part to chill recirculated air 1642. For example, where coolant loop 1640 passes chilled water to cooling system 1606 to remove heat from recirculated air 1642 via one or more various forms of heat transfer, such chilled water may be supplied to coolant loop 1640 from reclamation system 1620, where water is supplied to reclamation system 1620, at least in part, by precipitation 1617 received into passive cooling system 1616 from the ambient environment 1601 and routed from passive cooling system 1616 to reclamation system 1620 via one or more pathways 1619. In some embodiments, fluids, including precipitation, received into reclamation system 1620 via pathway 1619 may be chilled prior to being supplied into coolant loop 1640.

Figure 17:
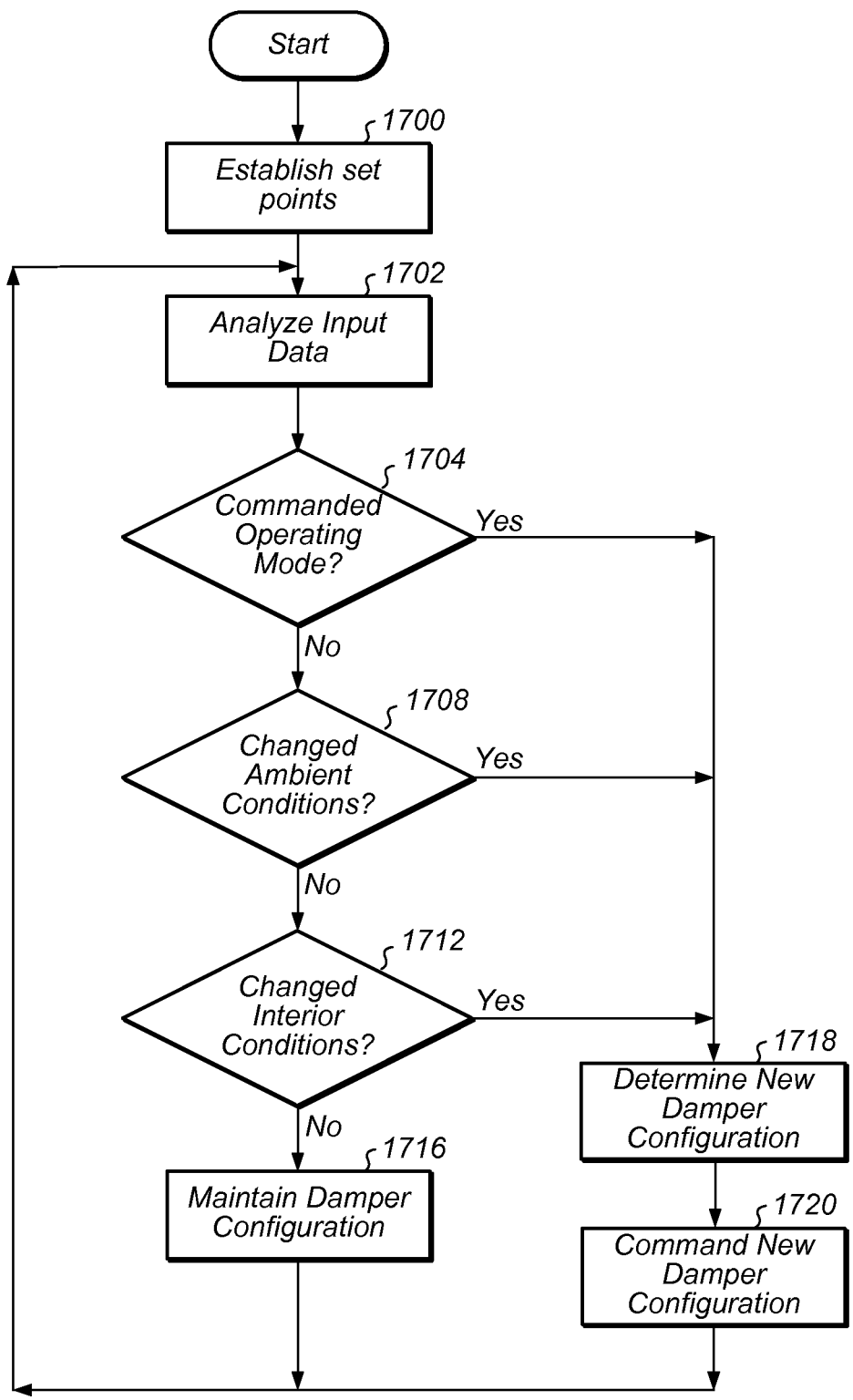
FIG. 17 illustrates managing configurations of dampers associated with one or more passive cooling systems according to one embodiment.

FIG. 17 illustrates managing configurations of dampers associated with one or more passive cooling systems according to one embodiment. Dampers managed thusly may include one or more exhaust dampers included in one or more damper systems that may be associated with one or more passive cooling systems.

Damper configuration management may be accomplished automatically, manually, or some combination thereof. In some embodiments, damper configuration management may be accomplished based at least in part upon a control system, which may be implemented at least in part by one or more computer systems. At 1700, set points are established for control conditions. Set points may include an initial configuration of one or more dampers. For example, dampers may be adjusted to an initial configuration consistent with a particular initial operating mode, including a free cooling mode. At 1702, input data is analyzed. Input data may include characteristics of air at various points in a system, including a passive cooling system. Measurements such as dry bulb temperature, wet bulb temperature, humidity, and pressure may be taken for ambient air, intake air, recirculated air, or at any other location.

At 1704, a determination is made whether an operating mode of a cooling system is commanded to be changed. A command may be sent from one or more control systems based upon an automatic command, a manual command, or some combination thereof. If an operating mode of a cooling system is changed, at 1718, a new damper configuration may be determined to at least partially facilitate the changed operating mode. For example, if a cooling system associated with the dampers is changed from cooling one or more waste heat sources using intake air to cooling the waste heat sources with recirculated air, a new configuration of exhaust dampers coupled to a passive cooling system that restricts air flow through the passive cooling system and directs the exhaust air to recirculate through a cooling system may be determined. At 1720, such a determined damper configuration may be commanded by one or more computer systems to adjust the dampers accordingly. For example, a control system implemented at least in part by one or more computer systems may command one or more motors associated with one or more dampers to adjust the one or more dampers in accordance with the determined damper configuration.

If, at 1708, operating mode is unchanged, a determination is made whether ambient conditions are changed with respect to one or more of air intake, air exhaust, or some combination thereof. If ambient conditions are determined to have changed, exceeded one or more threshold parameter values, or some combination thereof, a new damper configuration may be determined at 1718 and commanded at 1720. Such a determination at 1718 may involve selecting an operating mode. For example, if the ambient temperature is greater than a maximum threshold value, a control system may determine to switch from routing exhaust air through a passive cooling system to the ambient environment to recirculating exhaust air and may further determine a new configuration of exhaust dampers that facilitates such recirculation of exhaust air.

If, at 1712, ambient conditions are unchanged, do not exceed one or more threshold parameter values, or some combination thereof, a determination is made whether internal conditions within one or more enclosures, passive cooling system internal spaces, etc. are changed. If internal conditions are determined to have changed, exceeded one or more threshold parameter values, or some combination thereof, a new damper configuration may be determined at 1718 and commanded at 1720. Such a determination at 1718 may involve selecting an operating mode. For example, if the internal temperature of an enclosure having one or more waste heat sources is greater than a maximum threshold value, a control system may determine a new configuration of exhaust dampers that increases the flow of exhaust air from the enclosure. In another example, where the internal air pressure of the enclosure is below a threshold value, the control system may determine a new configuration of exhaust dampers that increases the internal air pressure of the enclosure by restricting air flow through a passive cooling system.

If, at 1716, interior conditions are not changed, a present damper configuration, operating mode, etc. may be maintained, and input data may continue to be analyzed.

Figure 18:
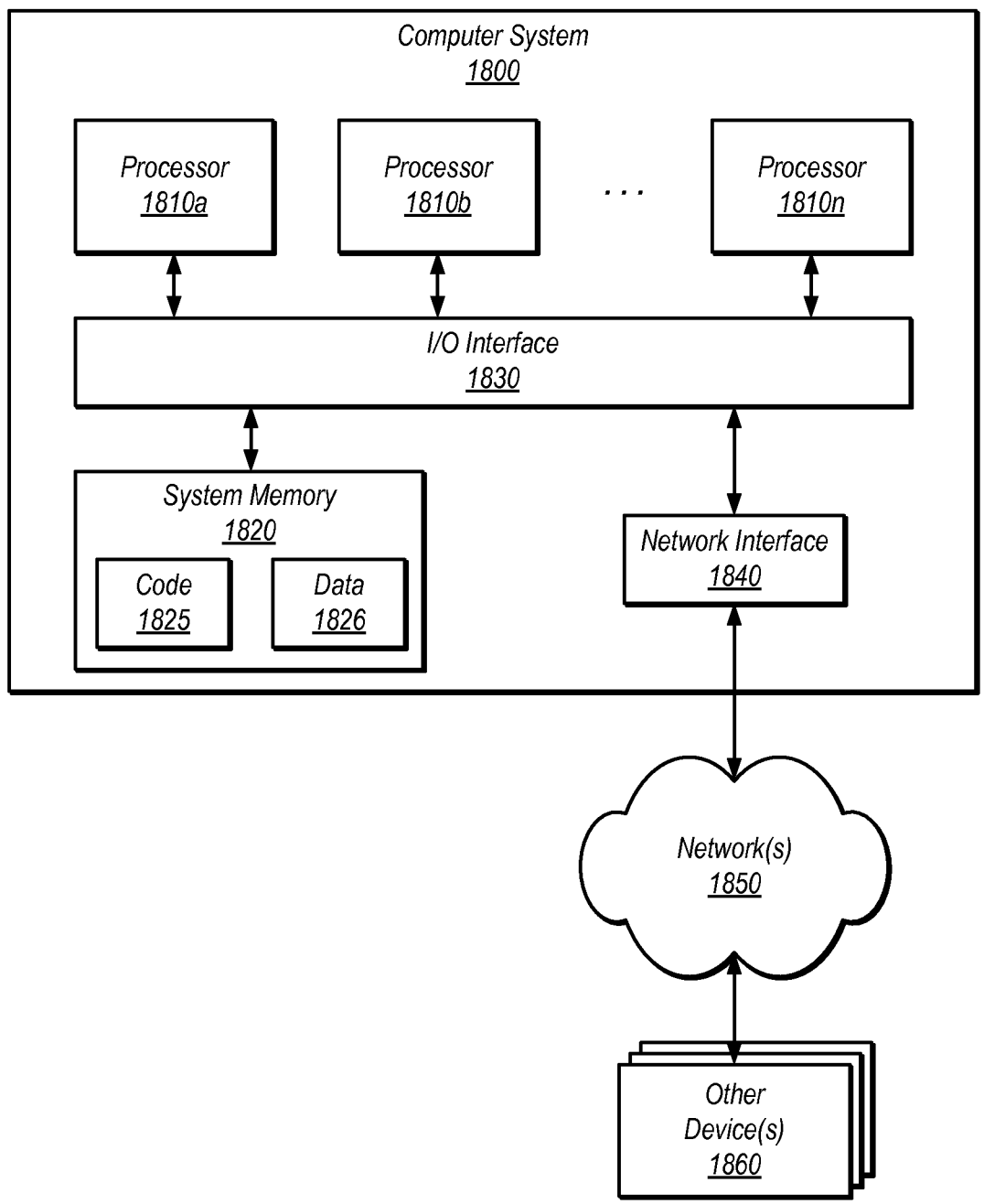
FIG. 18 is a block diagram illustrating an example computer system that may be used in some embodiments.

FIG. 18 is a block diagram illustrating an example computer system that may be used in some embodiments.

In some embodiments, a system that implements a portion or all of one or more of the technologies, including but not limited to a portion or all of the passive cooling system, one or more damper systems, one or more components of an air handling system, an enclosure cooling control system, one or more modules included in the cooling control system, and air distribution management methods, systems, devices, and apparatuses as described herein, may include a general-purpose computer system that includes or is configured to access one or more computer-accessible media, such as computer system 1800 illustrated in FIG. 18. In the illustrated embodiment, computer system 1800 includes one or more processors 1810 coupled to a system memory 1820 via an input/output (I/O) interface 1830. Computer system 1800 further includes a network interface 1840 coupled to I/O interface 1830.

In various embodiments, computer system 1800 may be a uniprocessor system including one processor 1810, or a multiprocessor system including several processors 1810 (e.g., two, four, eight, or another suitable number). Processors 1810 may be any suitable processors capable of executing instructions. For example, in various embodiments, processors 1810 may be general-purpose or embedded processors implementing any of a variety of instruction set architectures (ISAs), such as the x86, PowerPC, SPARC, or MIPS ISAs, or any other suitable ISA. In multiprocessor systems, each of processors 1810 may commonly, but not necessarily, implement the same ISA.

System memory 1820 may be configured to store instructions and data accessible by processor(s) 1810. In various embodiments, system memory 1820 may be implemented using any suitable memory technology, such as static random access memory (SRAM), synchronous dynamic RAM (SDRAM), nonvolatile/Flash-type memory, or any other type of memory. In the illustrated embodiment, program instructions and data implementing one or more desired functions, such as a portion or all of the passive cooling system, one or more damper systems, one or more components of an air handling system, an enclosure cooling control system, one or more modules included in the cooling control system, and air distribution management methods, systems, devices, and apparatuses as described herein, are shown stored within system memory 1820 as code 1825 and data 1826.

In one embodiment, I/O interface 1830 may be configured to coordinate I/O traffic between processor 1810, system memory 1820, and any peripheral devices in the device, including network interface 1840 or other peripheral interfaces. In some embodiments, I/O interface 1830 may perform any necessary protocol, timing or other data transformations to convert data signals from one component (e.g., system memory 720) into a format suitable for use by another component (e.g., processor 1810). In some embodiments, I/O interface 1830 may include support for devices attached through various types of peripheral buses, such as a variant of the Peripheral Component Interconnect (PCI) bus standard or the Universal Serial Bus (USB) standard, for example. In some embodiments, the function of I/O interface 1830 may be split into two or more separate components, such as a north bridge and a south bridge, for example. Also, in some embodiments some or all of the functionality of I/O interface 1830, such as an interface to system memory 1820, may be incorporated directly into processor 1810.

Network interface 1840 may be configured to allow data to be exchanged between computer system 1800 and other devices 1860 attached to a network or networks 1850, such as other computer systems or devices as illustrated in FIGS. 1 through 17, for example. For example, network interface 1840 may be configured to allow data to be exchanged between computer system 1800 and one or more a portion or all of the passive cooling system, one or more damper systems, one or more components of an air handling system, an enclosure cooling control system, one or more modules included in the cooling control system, and air distribution management, devices, and apparatuses as described herein, or the like. In various embodiments, network interface 1840 may support communication via any suitable wired or wireless general data networks, such as types of Ethernet network, for example. Additionally, network interface 1840 may support communication via telecommunications/telephony networks such as analog voice networks or digital fiber communications networks, via storage area networks such as Fibre Channel SANs, or via any other suitable type of network and/or protocol.

In some embodiments, system memory 1820 may be one embodiment of a computer-accessible medium configured to store program instructions and data for implementing embodiments of air distribution management methods as described above relative to FIGS. 1-17. In other embodiments, program instructions and/or data may be received, sent or stored upon different types of computer-accessible media. Generally speaking, a computer-accessible medium may include non-transitory storage media or memory media such as magnetic or optical media, e.g., disk or DVD/CD coupled to computer system 1800 via I/O interface 1830. A non-transitory computer-accessible storage medium may also include any volatile or non-volatile media such as RAM (e.g. SDRAM, DDR SDRAM, RDRAM, SRAM, etc.), ROM, etc., that may be included in some embodiments of computer system 1800 as system memory 1820 or another type of memory. Further, a computer-accessible medium may include transmission media or signals such as electrical, electromagnetic, or digital signals, conveyed via a communication medium such as a network and/or a wireless link, such as may be implemented via network interface 1840.

Various embodiments may further include receiving, sending or storing instructions and/or data implemented in accordance with the foregoing description upon a computer-accessible medium. Generally speaking, a computer-accessible medium may include storage media or memory media such as magnetic or optical media, e.g., disk or DVD/CD-ROM, volatile or non-volatile media such as RAM (e.g. SDRAM, DDR, RDRAM, SRAM, etc.), ROM, etc., as well as transmission media or signals such as electrical, electromagnetic, or digital signals, conveyed via a communication medium such as network and/or a wireless link.

The various methods as illustrated in the Figures and described herein represent example embodiments of methods. The methods may be implemented in software, hardware, or a combination thereof. The order of method may be changed, and various elements may be added, reordered, combined, omitted, modified, etc.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. An apparatus, comprising:
a plurality of side panels configured to at least partially bound an interior space;
a plurality of horizontally-extending vanes disposed within the interior space, wherein the plurality of horizontally-extending vanes is configured to route, via one or more vane ramps, fluids received into the interior space from a free-fall path into one or more vane gutters, and wherein:
the plurality of horizontally-extending vanes are arranged into a plurality of rows that are vertically-arranged and horizontally-offset, the plurality of rows comprising:
an upper row of horizontally-extending vanes comprising one or more perforated vanes, wherein at least one of the one or more perforated vanes is configured to communicate a portion of fluids received on to a perforated surface of the at least one of the perforated vanes through the at least one of the perforated vanes and direct another portion of the fluids to at least one vane gutter of the at least one of the perforated vanes; and
a lower row of horizontally-extending vanes that is below the upper row, wherein the lower row of horizontally-extending vanes comprises one or more non-perforated vanes, and wherein at least one of the non-perforated vanes is configured to direct the portion of fluids communicated through the at least one of the perforated vanes to at least one vane gutter of the at least one of the non-perforated vanes;
wherein the plurality of horizontally-extending vanes form, based at least in part on the horizontally-offset rows, an indirect pathway that is vertically oriented through the interior space between a bottom end of the interior space and a top end of the interior space; and
a panel gutter coupled to at least one of the plurality of side panels, wherein the panel gutter is configured to receive fluids from the respective vane gutters of the horizontally-extending vanes, such that at least some fluids received into the interior space and directed to the respective vane gutters of the horizontally-extending vanes are further directed to the panel gutter via the respective vane gutters.

2. The apparatus of claim 1, wherein the indirect pathway through the interior space is further configured to permit a passively induced flow of air through the interior space, along the indirect pathway, to an ambient environment based, at least in part, upon a chimney effect in the interior space.

3. The apparatus of claim 2, wherein the chimney effect is induced in the interior space by at least one of:
a pressure difference between at least a portion of an enclosure and the ambient environment, or
a temperature difference between at least a portion of the enclosure and the ambient environment.

4. The apparatus of claim 1, wherein the panel gutter is configured to direct fluids received from the respective vane gutters into a reclamation system for a mechanical cooling system.

5. The apparatus of claim 1, wherein at least one of the horizontally-extending vanes comprises:
the vane ramp and an additional vane ramp such that the horizontally-extending vane comprises two vane ramps, each extending along a long axis of the horizontally-extending vane, wherein the two vane ramps are coupled together at respective side edges and are each angled downward along a short axis of the horizontally-extending vane; and
the vane gutter and an additional vane gutter such that the horizontally-extending vane comprises two vane gutters, each extending along the long axis of the horizontally-extending vane and individually coupled to a separate one of the two vane ramps, such that the horizontally-extending vane is configured to direct a fluid received on a surface of one of the two vane ramps to a respective one of the two vane gutters coupled to the one of the two vane ramps.

6. The apparatus of claim 1, wherein:
the upper row of horizontally-extending vanes includes a horizontally-extending vane that includes two vane ramps and two vane gutters.

7. A data center, comprising:
a computer room comprising at least one computing system that outputs exhaust air; and
a passive cooling system configured to route the exhaust air, via a chimney effect, from the computer room to an ambient environment external to the computer room and further configured to preclude liquids received into the passive cooling system from the ambient environment from entering the computer room, the passive cooling system comprising:
a plurality of side panels configured to at least partially bound an interior space;
a plurality of horizontally-extending vanes disposed within the interior space, wherein the plurality of horizontally-extending vanes is configured to route, via one or more vane ramps, fluids received into the interior space from a free-fall path into one or more vane gutters, and wherein:
the plurality of horizontally-extending vanes are arranged into a plurality of vertically-arranged, horizontally-offset rows, the plurality of vertically-arranged, horizontally-offset rows comprising:
an upper row of horizontally-extending vanes comprising one or more perforated vanes, wherein at least one of the one or more perforated vanes is configured to communicate a portion of fluids received on to a perforated surface of the at least one of the perforated vanes through the at least one of the perforated vanes and direct another portion of the fluids to at least one vane gutter of the at least one of the perforated vanes; and
a lower row of horizontally-extending vanes that is below the upper row, wherein the lower row of horizontally-extending vanes comprises one or more non-perforated vanes, and wherein at least one of the non-perforated vanes is configured to direct the portion of fluids communicated through the at least one of the perforated vanes to at least one vane gutter of the at least one of the non-perforated vanes;

wherein the plurality of horizontally-extending vanes form, based at least in part on the horizontally-offset rows, an indirect pathway that is vertically oriented through the interior space between a bottom end of the interior space and a top end of the interior space; and a panel gutter coupled to at least one of the plurality of side panels, wherein the panel gutter is configured to receive fluids from the respective vane gutters, such that at least some fluids received into the interior space and directed to the respective vane gutters are further directed to the panel gutter via the respective vane gutters.

8. An apparatus, comprising:

a partial enclosure; and a plurality of horizontally extending vanes disposed within the partial enclosure and arranged in a plurality of vertically-arranged, horizontally-offset rows within the partial enclosure, such that each row comprises horizontally-extending vanes horizontally offset from horizontally-extending vanes of at least one other row, such that the plurality of horizontally-extending vanes form, between the horizontally-extending vanes, at least one vertically-oriented indirect pathway from a bottom end of the partial enclosure to a top end of the partial enclosure;

wherein the plurality of vertically-arranged horizontally-offset rows comprises:

an upper row of horizontally-extending vanes comprising one or more perforated vanes, wherein at least one of the one or more perforated vanes is configured to communicate a portion of fluids received on to a perforated surface of the at least one of the perforated vanes through the at least one of the perforated vanes and direct another portion of the fluids to at least one vane gutter of the at least one of the perforated vanes; and a lower row of horizontally-extending vanes that is below the upper row, wherein the lower row of horizontally-extending vanes comprises one or more non-perforated vanes, and wherein at least one of the non-perforated vanes is configured to direct the portion of fluids communicated through the at least one of the perforated vanes to at least one vane gutter of the at least one of the non-perforated vanes;

wherein the horizontally-extending vanes are configured to permit air to be passively channeled, based at least in part on a chimney effect, from an interior environment to an ambient environment along the at least one vertically-oriented indirect pathway through the partial enclosure; and wherein the horizontally-extending vanes are configured to re-direct precipitation entering the partial enclosure from a free-fall path from the ambient environment, such that the precipitation is removed from the partial enclosure via vane gutters of the horizontally-extending vanes and a panel gutter of the partial enclosure.

9. The apparatus of claim 8, comprising:

at least one panel gutter extending along at least a portion of an inner edge of the partial enclosure and configured to catch and remove precipitation from the partial enclosure; and wherein the horizontally-extending vanes are configured to redirect precipitation entering the partial enclosure from the ambient environment via the top end to the at least one panel gutter, such that the precipitation is removed from the partial enclosure.

10. The apparatus of claim 8, wherein:

the respective horizontally-extending vanes comprise a vane gutter configured to collect precipitation entering the partial enclosure from the ambient environment via the top end; and to redirect precipitation entering the partial enclosure from the ambient environment via the top end into the at least one panel gutter, the respective horizontally-extending vanes are configured to channel the collected precipitation through at least a portion of the respective vane gutters to a location external to the partial enclosure.

* * * * *